(12) United States Patent  
Krumpholz

(10) Patent No.: US 12,038,485 B2  
(45) Date of Patent: Jul. 16, 2024

(54) LIFETIME ESTIMATION OF ELECTROLYTIC CAPACITORS

(71) Applicant: Delta Electronics (Thailand) Public Co., Ltd., Samutprakarn (TH)

(72) Inventor: Christian Krumpholz, Teningen (DE)

(73) Assignee: Delta Electronics (Thailand) Public Co., Ltd., Samutprakarn (TH)

( * ) Notice: Subject to any disclaimer, the term of this patent is extended or adjusted under 35 U.S.C. 154(b) by 50 days.

(21) Appl. No.: 17/847,213

(22) Filed: Jun. 23, 2022

(65) Prior Publication Data

US 2022/0413059 A1 Dec. 29, 2022

(30) Foreign Application Priority Data

Jun. 23, 2021 (EP) .................... 21181255

(51) Int. Cl.
*G01R 31/392* (2019.01)
*G01R 31/64* (2020.01)

(52) U.S. Cl.
CPC ........... *G01R 31/392* (2019.01); *G01R 31/64* (2020.01)

(58) Field of Classification Search
None
See application file for complete search history.

(56) References Cited

U.S. PATENT DOCUMENTS

| | | | | |
|---|---|---|---|---|
| 2003/0111968 A1* | 6/2003 | Trestman | ........... | H05B 41/2928 315/291 |
| 2003/0185271 A1* | 10/2003 | Isozumi | ........... | G01K 3/04 374/45 |
| 2005/0287402 A1* | 12/2005 | Maly | ........... | H01M 8/04597 429/432 |
| 2015/0130380 A1 | 5/2015 | Kato | | |
| 2016/0377565 A1* | 12/2016 | Mollov | ........... | G01N 27/14 324/441 |
| 2017/0082680 A1* | 3/2017 | Eck | ........... | G06F 21/554 |
| 2020/0284662 A1 | 9/2020 | Yamamoto | | |

FOREIGN PATENT DOCUMENTS

| | | |
|---|---|---|
| CN | 102176377 A | 9/2011 |
| DE | 102004035723 A1 | 2/2006 |
| DE | 112018003260 T5 | 3/2020 |
| DE | 102012105198 B4 | 9/2020 |
| JP | H0627175 A | 2/1994 |

OTHER PUBLICATIONS

Corresponding extended European search report issued on Dec. 23, 2021.

* cited by examiner

*Primary Examiner* — Jas A Sanghera
(74) *Attorney, Agent, or Firm* — CKC & Partners Co., LLC

(57) ABSTRACT

The device to estimate the lifetime consumption of one or more electrolytic capacitors comprises a temperature sensor which is thermally insulated from the ambient by being arranged either between two equal electrolytic capacitors connected in parallel with each other or on the case of an electrolytic capacitors and where it is covered with a layer of thermally insulating material. The device comprises further a controller which is suitable to estimate the lifetime consumption based on the measurement data of the temperature sensor.

17 Claims, 5 Drawing Sheets

LIFETIME ESTIMATION OF ELECTROLYTIC CAPACITORS

CROSS-REFERENCE TO RELATED APPLICATION

This application claims priority to European Patent Application No. 21181255.7, filed on Jun. 23, 2021, which is hereby incorporated by reference in its entirety.

TECHNICAL FIELD

The present application relates to a device and a method to estimate the lifetime of electrolytic capacitors as well as an apparatus which uses electrolytic capacitors and comprises a device to estimate their lifetime according to the present application.

BACKGROUND

Electrolytic capacitors are known to age and this aging depends on the temperature of the electrolyte. Producers of electrolytic capacitors often provide their customers with formulas or nomograms to estimate the lifetime consumption at a given temperature. Similar to the Arrhenius equation describing chemical reaction rates as a function of a temperature, the lifetime consumption is estimated by an exponential function.

The documents DE 10 2012 105 198 B4 (ebm-papst), DE 11 2018 003 260 T5 (OMRON), DE 10 2004 035 723 (Siemens) and JP H 0 627 175 (Toyoda) teach to use temperature sensors located in different places of apparatuses in order to measure a temperature value which can be used to estimate a lifetime consumption.

DE 10 2012 105 198 B4 (ebm-papst) teaches that it is the electrolyte temperature which is of importance for the lifetime consumption and states that this temperature is influenced by the ambient temperature and the ripple current. However, the document is silent about the way to determine this ambient temperature.

DE 11 2018 003 260 T5 (OMRON) is mostly concerned about the determination of the ambient temperature from temperature readings of a sensor located inside an apparatus. In one embodiment, this document teaches to glue this temperature sensor on the side of one of the electrolytic capacitors and to use the measurement to estimate the residual lifetime of the apparatus in addition to the ambient temperature.

DE 10 2004 035 723 (Siemens) considers the situation of an electric motor. The power deposited in the capacitor and an ambient temperature are input parameters of a thermal model which determines the core temperature of the capacitor. The core temperature of the capacitor is then used to estimate the residual lifetime. The ambient temperature is assumed to be the temperature of a circulating cooling liquid used to cool the motor.

JP H 0 627 175 (Toyoda) finally presents two different methods: In a first example, a temperature sensor is arranged inside the capacitor which measures the core temperature directly. In a second example a detector measures the ripple current and a temperature sensor measures the temperature near the periphery of the capacitor and these two measurements are used to estimate the core temperature.

The lifetime consumption depends exponentially on the core temperature. Therefore uncertainties in the estimate of the core temperature cause great uncertainties in the estimated lifetime. As the lifetime consumption is integrated over time to yield the total lifetime consumption, the uncertainty can reach values which make the result essentially useless. Arranging a sensor inside the capacitor is technically challenging and bears the risk that, due to an additional opening in the sealing, the electrolyte evaporates faster than without the sensor which would limit the lifetime of the capacitor. The use of thermal models of the inside of an apparatus is difficult, as there are in general different electrical parts which produce different amount of heat when used in different situations. In addition, it is in most cases unknown how a given apparatus will be arranged in the room where it is finally used and therefore, the cooling efficiency of different parts of the housing of the apparatus is in general unknown to the producer. Therefore, thermal models which links a temperature measured at some place inside or outside an apparatus to the core temperature of an electrolytic capacitor located at a specific place inside the apparatus have large uncertainties. This large uncertainty in the electrolyte temperature causes an even greater uncertainty in the estimated lifetime consumption due to the exponential relation. As the residual lifetime is estimated by using the total consumed lifetime which is an integral over many lifetime consumptions the uncertainty increases even more, resulting in an estimate of limited practical value. A residual lifetime estimate is preferably of limited practical value if the relative uncertainty of the preliminary predicted lifetime is greater than + or −25%.

SUMMARY

It is therefore the object of the present application to create a device to estimate the lifetime of one or more electrolytic capacitors, that allows to estimate the residual lifetime with a smaller uncertainty and which can readily be used in different apparatus.

In a preferred embodiment, the device according to the present application is designed to archive a relative uncertainty of the preliminary predicted lifetime between −10% and 10%, particularly preferred between −5% and 5%, if the apparatus is used in regularly repeating usage cycles.

The solution of the present application is specified in appended claims. According to the present application, the device to estimate the lifetime of one or more electrolytic capacitors (ELCO) comprises a temperature sensor and a controller which is suitable to estimate the lifetime consumption of an electrolytic capacitor based on the measurement data of the temperature sensor.

The temperature sensor is thermally insulated from the ambient. This thermal insulation is realized by either arranging the temperature sensor between two equal electrolytic capacitors connected in parallel with each other. Or the temperature sensor is arranged on the case of an electrolytic capacitor and the thermal insulation is realized by covering the temperature sensor with a layer of thermally insulating material.

Both arrangements of the temperature sensor ensure that the temperature which is measured is the temperature of the case of the electrolytic capacitor. An increased local heating by, for example, another heat source close by is avoided: In the one embodiment, the layer of thermally insulating material prevents a local heating. In the other embodiment, the temperature sensor is located between two equal heat sources which shield the sensor from local heating or cooling by other heat sources and thereby provide a thermal insulator from the ambient.

In addition, this sensor arrangement is independent from the arrangement of further components, the size and the surrounding of the apparatus in which the device is used. The case of electrolytic capacitors is typically made of metal such as Aluminum and conducts heat therefore very well. Therefore, the variation of the temperature along the case is small and the measurement at the thermally isolated location is a representative value of the case temperature. The thermal model underlying the residual lifetime estimation depends therefore only on the properties of the electrolytic capacitors. Therefore, the device can be used in many different apparatus and situations.

In the preferred embodiment of arranging the temperature sensor between two equal electrolytic capacitors which are connected in parallel, allows a precise measurement without decreasing the surface area available to cool the electrolytic capacitors. As the electrolytic capacitors are the same and as they are connected in parallel, they will, possibly after an initial time interval during which one of the electrolytic capacitors ages faster than the other, have essentially the same case temperature. Therefore, the sensor, arranged between them is thermally insulated from other heat sources or sinks.

In the preferred embodiment in which the temperature sensor is arranged between two equal electrolytic capacitors, the shape of the capacitors is approximately a round cylinder with a radius R and a height h. The capacitors are arranged with their longitudinal axis being parallel and being arranged in a distance 2D from each other. In this case, the temperature sensor is in the direction perpendicular to the connecting line of the two longitudinal axis and perpendicular to the two longitudinal axis smaller than the difference between the square root of 8 and the distance 2D between the two capacitors. Further, in the direction parallel to both longitudinal axis and perpendicular to the connecting line of the two longitudinal axis, the temperature sensor is smaller than the difference between the height h and the distance 2D minus twice the radius R. In an implementation, the temperature sensor is placed inside a cuboid volume with a width ($B_Q$) equal to the difference between the square root of 8 times the radius and the distance 2D ($B_Q=\sqrt{8}R-2D$), with a height ($H_Q$) equal to the difference between the height of the capacitors and their distance 2D minus twice the radius R ($H_Q=h-(2D-2R)$) and with a depth ($T_Q$) equal to the difference between the distance 2D of the two capacitors and twice of the square root of the difference between the radius R squared and half of the width of the volume squares $$T_Q = 2D - 2\sqrt{R^2 - \left(\frac{B_Q}{2}\right)^2}.$$

This volume is located between the two capacitors such that the height is parallel to the longitudinal axis of the two capacitors, the depth is parallel to the connection line between the two capacitors. The center of this volume is located on the middle of the connection line. The capacitors are partially located inside this volume, allowing a temperature sensor according to this embodiment to be mounted onto the case of one of the capacitors.

In the case of capacitors of different shape, the volume into which the temperatures sensor should be placed is estimated to be the set of points with the following properties: The aperture at every one of these points, which is unobstructed by the capacitors at hand, is in every direction of observation in at least one line perpendicular to the observation direction, restricted to at least 90°. It was found that by choosing the location of the temperature sensor inside this volume, the desired thermal insulating effect by the capacitors is particularly pronounced.

Arranging the temperature sensor on the case of an electrolytic capacitor and thermally insulating it by covering it with a layer of thermally insulating material allows the device to comprise only one electrolytic capacitor. In order to minimize the loss of cooling ability, in an implementation, the temperature sensor is arranged in a region which is difficult to cool even without the insulating material such as between the electrolytic capacitor and a mounting board or parts of the casing of the apparatus.

In the following description, the lifetime of the capacitors is described by different parameters.

The "lifetime" is the estimated lifetime of the capacitor at hand assuming that it is used under the conditions present at the moment for its entire service life. The lifetime is expressed in units of time, for example in hours. With the conditions changing over time, the lifetime will change over time and it may increase or decrease.

The "total lifetime" is the time the capacitor at hand will be working when being subject to the conditions it was and it will be subject, too. A clock, started when the capacitor is built and stopped in the moment when the capacitor fails, would show the "total lifetime". The total lifetime is expressed in units of time.

The "base lifetime" $L_0$ is the lifetime of the capacitor at hand at its maximum rated category temperature $T_0$ and when subject to its reference ripple current $I_S$. The base lifetime is expressed in units of time, for example in hours. The base lifetime is a parameter in the models to estimate the lifetime. Therefore, the unit of the base lifetime is in many cases, and if the unit is not changed on purpose, the unit of the lifetime.

The "age" of a capacitor is the duration between the production of the capacitor and the moment at hand. The age is expressed in units of time.

The "maximum age" is the duration the capacitor at hand would be working if it is not used but only stored at room temperature without specific protection but also without the exposure to specific extreme conditions. The maximum age is expressed in units of time, typically years. A typical maximum age is about 15 years for common electrolytic capacitors.

The "lifetime consumption" is the fraction of the lifetime consumed per unit time. It can be expressed in percent per unit time or in parts per unit time. The lifetime consumption depends on the conditions present at the moment. The lifetime consumption is inverse proportional to the lifetime.

The "total lifetime consumption" is the lifetime consumption since the beginning of the use of the capacitor. It is the integral of the lifetime consumption over time, beginning with the use of the capacitor until the moment at hand. Typically, the total lifetime consumption has a value between 0 and 1 or 0% and 100%, depending on the chosen unit. If the total lifetime consumption is greater than 1 respectively 100%, the risks of a failure or a non-nominal behavior of the capacitor is high. The duration needed for the total lifetime consumption to rise from 0 to 1 respectively from 0% to 100% is the total lifetime if this duration is shorter than the maximum age.

The "usage cycle lifetime consumption" is the lifetime consumption during a single usage cycle.

The "preliminary predicted lifetime" is the predicted duration for the total lifetime consumption to rise from 0 to 1 respectively from 0% to 100%. This prediction is based on an extrapolation of the total lifetime consumption. The preliminary predicted lifetime is expressed in units of time.

The preliminary predicted lifetime may change over the life of the capacitor as the extrapolation of the total lifetime consumption may be amended. If the lifetime of a capacitor is not limited by its maximum age, the preliminary predicted lifetime is an estimate for the total lifetime.

The "residual lifetime" is the difference between the smaller one of the preliminary predicted lifetime and the maximum age and the age of the capacitor. It is expressed in units of time.

In this document, an electrolytic capacitor which "fails" is a capacitor with properties, such as the capacitance or the equivalent series resistance, which have changed by an unacceptable amount with respect to the nominal values. Although the amount of acceptable deviation from the nominal values depends on the application, the deviation typically increases fast once the total lifetime has been reached. Therefore, the exact choice of the threshold to declare a capacitor has failed is of little relevance here. In an implementation, the base lifetime $L_0$, the maximum age and the lifetime estimates use the same threshold to define "failure".

In a preferred embodiment, the device comprises a meter which can measure an output or input data. The output or input data comprises a voltage, a power or a current which is either influenced by the one or more electrolytic capacitors or which influences the one or more electrolytic capacitors. The controller of this embodiment is suitable to include the measured output or input data in its estimation of the lifetime consumption of the electrolytic capacitor.

Especially aluminum electrolytic capacitors create internal heat when ripple currents flow through them. Measuring the output or input data allows, together with known properties of the apparatus in which the electrolytic capacitors are used and therefore the implicit information on how the measured data correlates with the ripple current through the capacitor, to estimate this internally produced heat and thereby the use of a more precise thermal model of the electrolytic capacitor.

In an implementation, a voltage, power or current influences the capacitor or is influenced by the capacitor if a change in this voltage, power or current changes the ripple current through the capacitor. Besides the magnitude of the voltage, power or the current, the measured property may be the frequency, the mode the waveform and/or the number of phases.

The heating caused by ripple currents depends on their frequencies. A given apparatus, reacts in a situation specified by its input and its output in a similar way over its lifetime. Consequently, the ripple currents which flow through the electrolytic capacitors are essentially the same if the input and the output of the apparatus are the same.

In many cases, the input conditions are known, as an apparatus is often built for specific input conditions such as a one or three phase voltage with a given root mean square voltage and frequency and a known line voltage waveform or a known mode. Also, the number phases and the mode of the output is often given by the circuitry and the specification of the apparatus. Therefore, in such embodiments, a measurement specifying the output voltage, power or current is sufficient to determine the situation of the apparatus and to derive therefrom the effective ripple current.

In many cases, the output conditions are known, as an apparatus is often built to provide specific output conditions such as a one or three phase voltage with a given root mean square voltage, mode, frequency, and a known output voltage waveform. Also, the number phases and the mode of the input is often given by the specification of the apparatus.

Therefore, in such embodiments, a measurement specifying the input voltage, power or current is sufficient to determine the situation of the apparatus and to derive therefrom the effective ripple current.

The waveform of the input or the output may be, for example, sinusoidal, rectangular, triangular, or flat. The mode of the input or the output may be, for example, a dc or an ac voltage. In an implementation, the controller comprises or is able to access a memory in which the association between the measured property such as the output voltage, the current or the power, and the effective ripple current is given. This association can be done for example in the form of a look-up-table or in the form of a formula.

In an implementation, the association is derived by the manufacturer of the apparatus and read into the controller when the device is installed in a given apparatus. The association can be determined by measuring the ripple currents with a sufficiently high time resolution in a laboratory for a representative set of possible input and output conditions of the apparatus at hand. The measured ripple currents are analyzed, for example by a Fourier transformation, to get the frequencies and the RMS values at each of the involved frequencies. The equivalent series resistance (ESR) of electrolytic capacitors depends on the ripple current frequency. This dependency can be measured. A frequency multiplier for each frequency can be obtained by calculating the square root of the fraction of the ESR at a standard frequency to the ESR at the frequency in question. The effective ripple current is defined as the square root of the sum of the squares of the quotients of the ripple current at a given frequency over the frequency multiplier of the frequency in question.

By storing directly the effective ripple currents, this embodiment is computationally efficient: There is no need for a detailed frequency analysis and no need to calculate the effective ripple currents during the nominal operations.

In other embodiments, the output and input of the apparatus are always the same during the use of the apparatus at hand or there is only a limited set of different input and output situations. In such embodiments, the estimation of the lifetime consumption can be based purely on the case temperature measurements and, in some embodiments, on an information which one of the in- and output situation in the given set is applied. In other embodiments, the current in- and output situation is determined based on the development of the case temperature. In all of these embodiments, an effective ripple current value is either explicitly as such obtainable by the controller or the effect of these one or few effective ripple current values is implicitly incorporated in the way the controller estimates the lifetime consumptions.

In an apparatus where it is known that only very little power will be dissipated inside the capacitor, the effect of internal heating may be neglected in the estimation and be considered part of the uncertainty.

An apparatus according to the present application comprises at least one electrolytic capacitor and a device according to the present application.

In many cases, it is the lifetime of the electrolytic capacitors which limits the lifetime of an apparatus comprising such capacitors. Equipping an apparatus with the device according to the present application allows to estimate the time at which a replacement of the apparatus or its electrolytic capacitor is needed.

In one embodiment, the device comprises either a first and a second detector or an ammeter. The controller is suitable to include the measurements of the first and the second detector respectively the ammeter in the estimation of the lifetime consumption.

The first detector is suitable to measure an input voltage, an input current and/or an input power to the apparatus. The second detector is suitable to measure an output voltage, an output current and/or an output power of the apparatus. The ammeter is suitable to measure a current through the one or more electrolytic capacitors.

The use of the first and the second detector allows to use the device in an apparatus where the properties of the input and the output may be changed and are therefore not a priori known to the manufacturer of the apparatus. In these cases, the first and the second detector can detect which one of the possible input and output situation is given. For example, the measurements can be used to detect the RMS value of the input voltage or current and the number of phases and to decide if the output of the apparatus is an AC or a DC voltage, the number of phases if applicable, as well as its voltage and/or current. In one embodiment, the measurements of the first detector are used to detect in addition the input frequency and the line voltage waveform. In one embodiment, the measurements of the second detector are used to detect in addition the output frequency and the output voltage waveform. The line voltage waveform can be for example of a sinusoidal, a rectangular or a triangular shape or it can be flat, indicating a DC voltage.

In an implementation, the controller comprises or is able to access a memory in which the association between the detected input and output properties and the effective ripple current is given. This association can be done for example in the form of a set of look-up-tables or in the form of one or more formulas. In an implementation, there a separate look-up-tables or formulas for, if applicable, the different possible combinations of phases on in- and output, for AC and DC output while the tables and/or formulas connect the RMS voltages, currents or power detected by the first and second detector to the effective ripple current for the apparatus at hand. In an implementation, the association is derived by the manufacturer of the apparatus and read into the controller when the device is installed in a given apparatus.

The use of an ammeter measuring the current through the one or more electrolytic capacitor allows to measure the ripple current directly. In embodiments without any knowledge about the way the apparatus reacts to input and output conduction or in embodiments where the device can only access information in the direct vicinity of the electrolytic capacitors, measuring the ripple current directly and calculating the effective ripple current in the controller is preferred.

Finally, in some embodiments, the controller may have information about the number of phases on the input of the apparatus and the characteristic on the output either because of the specifications of the apparatus or because of the detections of the first and the second detector. In these cases, the controller can have access to a list and frequency multipliers of a set of frequencies expected to occur in the ripple current. Only the contribution of these frequencies to the measured current is used to estimate the effective ripple current. This embodiment lowers the requirements on the first and the second detector as they only need to detect a number of phases or distinguish between AC and DC voltage. The computational power needed to analyze the ripple current is lower than without prior assumption about the occurring frequencies.

In a preferred embodiment of the apparatus according to the present application, the controller estimates the effective ripple current $I_a$ considering the number of phases and/or the mode and/or the waveform on the input of the apparatus and an output mode of the apparatus as well as a measured or given power or current or input voltage value.

It was found that the frequencies of the ripple current are strongly influenced by the number of phases, the mode and sometimes the waveform on the input of the apparatus and on the output mode. In a preferred embodiment, in which the apparatus is a power supply, the output or input mode may be an AC or a DC current. If the number of phases on the input and the output mode are known, the frequencies of importance are known as well as the distribution of the total current to these frequencies. The measured or known power or current or input voltage value is only needed to scale this distribution.

Using the information about the number of phases, the mode and/or the waveform on the input and the output mode is computational much more efficient and faster than evaluating the frequencies of the ripple current in a series of ripple current measurements. Further, the sample frequency can be significantly lower in the preferred embodiment compared to an embodiment where the ripple current frequencies are measured.

In an even more preferred embodiment of the apparatus according to the present application, the controller estimates the effective ripple current $I_a$ by using one of a set of look-up-tables. The look-up-table to be applied is chosen depending on the number of phases, the mode and/or the waveform on the input of the apparatus and on an output mode of the apparatus. The look-up-table returns the effective ripple current and in an implementation, the look-up-table returns an uncertainty in the effective ripple current $I_a$ at a given or measured output power value or at a given or measured current value or at a given or measured input voltage value.

As the number of possible input phases, modes and waveforms and output modes is limited, saving this knowledge in look-up-tables allows a reliable and fast determination of the effective ripple currents $I_a$ in all possible cases for a given apparatus. However, the knowledge can also be saved in the form of formulas and/or suitable correction factors in the controller or in a memory accessible by the controller.

In other embodiments, the ripple current is sampled with a frequency of at least twice the highest frequency of interest to the situation at hand and the measurements are analyzed to determine the ripple currents at different frequencies. In an implementation, this analysis is a Fast Fourier Transformation (FFT). In this embodiment, the ESR values or frequency multipliers for the capacitor at hand at the different frequencies are obtainable by the controller for example by being saved in the form of a table or a function in a memory which is part of or accessible by the controller. In an implementation, the frequency multiplier of a given frequency is the square root of the ratio of the ESR value of the frequency $f_0$ of the reference ripple current $I_S$ and the ESR value of this given frequency. In this embodiment the effective ripple current $I_a$ is determined calculating the square root of the sum of the squares of the ratios of the ripple currents at each of the frequencies and the frequency multiplier at the respective frequency. The highest frequency of interest may be determined in an iterative way by determining the effective ripple current assuming a first value of the highest frequency of interest and the second value of the highest frequency of interest in a load situation in which high frequency ripple currents are expected and comparing the results. If the difference is smaller than the acceptable uncertainty, the smaller on of the first and second value of the highest frequency of interest is set as highest frequency of interest for the following measurements.

In one embodiment, the apparatus is a power supply. The power supply comprises a rectifier, a bulk capacitor, a transformer and in an implementation, the power supply further comprises an output capacitor. The bulk capacitor comprises the at least one electrolytic capacitor. It is the lifetime consumption of the bulk capacitor which is estimated with a device according to the present application.

The estimate of the lifetime consumption is in this case particularly helpful as the power supply will not fail completely once their lifetime is consumed but will start to run out of their specification by producing more ripple and noise. A power supply delivery power differently than expected may cause an unexpected behavior of the devices using the power supply in question. It is often challenging to find the cause of such problems. The device according to the present application, however, points the user to the problem of degraded electrolytic capacitors of the power supply and facilitates thereby the repair.

A switching circuit may be employed before the transformer to create a high frequency AC-current which allows an efficient transformation to the desired voltage.

In one embodiment of the device according to the present application, the controller estimates the lifetime ($L_x$) of the at least one electrolytic capacitor by calculating the product of a first capacitor type depending constant ($C_1$) and a first and a second exponential function. The exponent of the first exponential function is the case temperature measured by the temperature sensor ($T_c$). In an implementation, the basis of the first exponential function is a constant which is independent of the capacitor type (Q).

The exponent of the second exponential function is the square of an effective ripple current ($I_a^2$). In an implementation, the basis of the second exponential function is a second capacitor type depending constant ($C_2$).

Written as a formula, the controller according to this embodiment estimates the lifetime by calculating $L_x = C_1 Q^{T_c} C_2^{I_a^2}$.

The first and the second capacitor type depending constants $C_1$ and $C_2$ depend on the electrolytic capacitor, while the constant Q is the same for all capacitors. $T_c$ is the case temperature, which is the temperature measured by the sensor. The case temperature $T_c$ may be given in °C. or in K, however, the value of the constant $C_1$ depends on this choice, too. $I_a$ is the effective ripple current which is frequency dependent. The effective current can either be measured or estimated. In an implementation, $I_a$ is normalized to the frequency of the rated ripple current $I_S$ which influences the second capacitor type depending constant $C_2$. Such a normalization can be done by multiplication with a correction factor. In an implementation, the correction factor depends on the equivalent series resistances at the different ripple current frequencies.

The constants may be determined by experiments, such as observing the lifetime of a given capacitor at the same effective current but at different case temperatures to determine Q and to observe the lifetimes of two different capacitors, in an implementation, each one at the same case temperature but at a first and a second effective current, to evaluate the capacitor depending constants $C_1$ and $C_2$ for both capacitors.

However, in an implementation, the constants are chosen to equal the following values:

$$C_1 = L_0 2^{\frac{T_0}{10K}} 2^{\frac{\Delta T_m}{5K}}, \quad C_2 = 2^{-\frac{ESR}{10K}(2R_{thjc} + R_{thca})},$$

$$Q = 2^{-\frac{1}{10K}}, \quad ESR = \frac{\Delta T_m}{(R_{thjc} + R_{thca}) I_S^2}$$

whereby $\Delta T_m$, $R_{thca}$, $R_{thjc}$, $I_S$ are parameters of the thermal model of the capacitor. K indicates the unit "Kelvin" and appears explicitly to allow a check on the units in the result. Specifically, $\Delta T_m$ is the temperature difference between the core and the ambient at a reference ripple current $I_S$. $R_{thca}$ is the thermal resistance between the case and the ambient. $R_{thjc}$ is the thermal resistance between the core and the case. In an implementation, the model describes an idealized situation in which the capacitor is mounted on a flat surface in a room of constant temperature of for example 25° C. and at an air pressure or 1 bar. "Ambient" is in this preferred model the atmosphere of this room.

$T_0$, $L_0$ and ESR are parameters describing the capacitor: $T_0$ is its maximum rated category temperature and $L_0$ is the base lifetime. The base lifetime $L_0$ is the lifetime of the capacitor at the ambient temperature equal to the maximum rated category temperature $T_0$ and the reference ripple current $I_S$. ESR is the equivalent series resistance of the capacitor measured at a frequency of the reference ripple current $I_S$.

The values of $\Delta T_m$, $R_{thca}$, $R_{thjc}$, $I_S$, ESR, $T_0$, $L_0$ are often provided by the producer of the electrolytic capacitor.

The lifetime $L_x$ is estimated with the formula given above in the time unit which was used for the base lifetime $L_0$. In general, the case temperature $T_C$ and/or the effective ripple current $I_a$ vary with time and therefore, only a part of the estimated lifetime $L_x$ is actually used during a time segment $\Delta t$ during which the case temperature $T_C$ and/or the effective ripple current $I_a$ are essentially constant.

The thermal model on which these formulas are based represents the capacitor by a heat source in its core, which is the dissipated ripple current and by a second heat source which is the ambient air. In between, the heat is conducted from the core to the case and from the case to the ambient. The efficiency of this heat conduction is described by the thermal resistivities $R_{thjc}$, $R_{thca}$.

The internal power loss and thereby the heating in the core of the capacitor is described by the equivalent series resistance ESR. At the reference ripple current $I_S$, the power loss heating the core is $W = ESR \cdot I_S^2$. An analogue model of ohms law can be applied to thermal conduction in a steady state situation where the ratio of the temperature difference and the thermal energy conducted through a given structure equals its thermal resistance:

$$R_{th} = \frac{\Delta T}{W}.$$

This law is applied for the structure between the core and the ambient as well as for the structure between the core and the case. The power loss W, which heats the capacitor is of course the same in both cases, if the ripple current is the same. Therefore $$W = \frac{\Delta T_m}{R_{thjc} + R_{thca}} = \frac{T_j - T_c}{R_{thjc}} = \frac{T_c - T_a}{R_{thca}}$$

at a given ripple current. In the measurement situation, the temperatures difference between the ambient and the core $\Delta T_m$ is known for the reference ripple current $I_S$ with a ripple frequency $f_0$, while the case temperature $T_c$ will be measured in a situation with a different ripple current having a ripple frequency $f_a$, which is in general different from the ripple frequency $f_0$. In general, the ESR depends on the ripple frequency. However, the effective ripple current $I_a$ is defined to include a multiplier which cancels this frequency dependence of the ESR. Therefore, if the effective ripple current $I_a$ is used to characterize the ripple current, the ESR is the same for all ripple current frequencies. The equation given above can thus be modified to consider differences in the occurring, effective ripple currents $I_S$, $I_a$, $I_b$:

$$ESR = \frac{\Delta T_m(I_S)}{R_{thjc} + R_{thca}} I_S^{-2} = \frac{\Delta T(I_a)}{R_{thjc} + R_{thca}} I_a^{-2} = \frac{T_j(I_b) - T_c(I_b)}{R_{thjc}} I_b^{-2} = \frac{T_c(I_a) - T_a(I_a)}{R_{thca}} I_a^{-2}.$$

This allows to express the ambient temperature, a parameter of the thermal model which is difficult to measure with sufficient accuracy, as a function of $\Delta T_m(I_S)$, which is a property to the capacitor and the case temperature at a given effective ripple current $I_a$:

$$T_a(I_a) = T_c(I_a) - \Delta T_m(I_S) \frac{R_{thca}}{R_{thjc} + R_{thca}} \left(\frac{I_a}{I_S}\right)^2$$

The temperature difference between the ambient and the core $\Delta T = T_j - T_a$ at an effective ripple current $I_a$, can be derived from the same equation to be:

$$\Delta T(I_a) = \Delta T_m(I_S) \left(\frac{I_a}{I_S}\right)^2$$

It was experimentally found that the lifetime of an electrolytic capacitor can be expressed as follows:

$$L_X(I_a, T_a) = L_0 2^{\frac{T_0 - T_a}{10K}} 2^{\frac{\Delta T_m - \Delta T(I_a)}{5K}}$$

wherein $T_0$ is a reference temperature, $I_S$ is the reference ripple current and $\Delta T_m$ is the temperature difference between the core and the ambient when the reference ripple current $I_S$ is flowing through the capacitor. K is the unit Kelvin. $L_0$ is the lifetime if the ambient temperature $T_a$ equals the reference temperature $T_0$ and the effective ripple current $I_a$ equals the reference ripple current $I_S$.

Using the above derived equation, the lifetime can be expressed as a function of the case temperature:

$$L_X(I_a, T_c) = L_0 2^{\frac{T_0 - T_c(I_a) + \Delta T_m \frac{R_{thca}}{R_{thjc}+R_{thca}}\left(\frac{I_a}{I_S}\right)^2}{10K}} 2^{\frac{\Delta T_m\left(1-\left(\frac{I_a}{I_S}\right)^2\right)}{5K}}$$

$$L_X(I_a, T_c) = L_0 2^{\frac{T_0}{10K}} 2^{\frac{\Delta T_m}{5K}} 2^{-\frac{T_c(I_a)}{10K}} 2^{-\frac{\Delta T_m}{10K}\left(2-\frac{R_{thca}}{R_{thjc}+R_{thca}}\right)\left(\frac{I_a}{I_S}\right)^2}$$

$$L_X(I_a, T_c) = L_0 2^{\frac{T_0 + 2\Delta T_m}{10K}} \left(2^{-\frac{\Delta T_m}{10KI_S^2}\left(2-\frac{R_{thca}}{R_{thjc}+R_{thca}}\right)}\right)^{I_a^2} \left(2^{-\frac{1}{10K}}\right)^{T_c(I_a)}$$

Using the above defined constants, the above given relationship between lifetime, the measured case temperature Tc and the measured or estimated effective ripple current $I_a$ results: $L_X(I_a, T_c) = C_1 C_2^{I_a^2} Q^{T_c}$.

In a preferred embodiment, the controller estimates a lifetime consumption (LC) of the at least one electrolytic capacitor during a time segment ($\Delta t$) to be proportional to the quotient of the time segment ($\Delta t$) over the lifetime. The lifetime is determined for the case temperature ($T_c$) and the effective ripple current ($I_a$) which are measured or assumed to occur during this time segment.

In an implementation, the lifetime consumption is determined in order to be able to integrate it over time and to estimate thereby the residual lifetime. In an implementation, the lifetime consumption LC is expressed in a percentage or a fraction of the lifetime. As the lifetime may differ from time segment to time segment, the lifetime consumption may differ between subsequent time segments, too.

The lifetime consumption LC at a specific point in time is inverse proportional to the lifetime $L_X$:

$$LC_c(t) \propto \frac{1}{L_x}.$$

In a preferred embodiment, the time segment $\Delta t$ is chosen such that the case temperature $T_c$ and the effective ripple current $I_a$ are essentially constant during its duration. In this preferred embodiment the lifetime consumption of this time segment is proportional to the quotient of the time segment over the lifetime evaluated using the conditions during this time segment:

$$LC_d(\Delta t) \propto \frac{\Delta t}{L_x}.$$

The subscript c is used to denote the continuous case, where the lifetime and the lifetime consumption is determined individually for every moment in time. The subscript d is used to denote the discrete case where the time is divided in time segments $\Delta t$ of possibly small but measurable duration.

In an implementation, the lifetime consumption of a time segment is expressed in percent and in this case $$LC_d(\Delta t) = 100\% \cdot \frac{\Delta t}{L_X}.$$

In another preferred embodiment the lifetime consumption of a time segment is expressed in parts of 1, such that $$LC_d(\Delta t) = \frac{\Delta t}{L_X}.$$

Using the expression given above for the lifetime estimate, the lifetime consumption of a time segment $\Delta t$ is a follows:

$$LC_d(\Delta t) \propto \frac{\Delta t}{L_X} = \Delta t C_1^{-1} C_2^{-I_a^2} Q^{-T_c}.$$

In the case of the lifetime consumption being expressed in parts of the lifetime it can be expressed as follows:

$$LC_d(\Delta t) = \frac{\Delta t}{L_X} = \Delta t C_1^{-1} C_2^{-I_a^2} Q^{-T_c}.$$

It is therefore possible to estimate the lifetime consumption without determining the lifetime in an independent calculation previously.

In one embodiment of the apparatus according to the present application, the controller determines an uncertainty in the lifetime consumption taking into account the uncertainties in the case temperature, the effective ripple current and in an implementation, the controller determines an uncertainty in the lifetime consumption taking into account the uncertainties in the case temperature, the effective ripple current and the time segment.

Keeping track of the uncertainty helps to interpret the result. As the measured parameters, in an implementation, case temperature, case temperature measured at least indirectly, the effective ripple current, are found in the exponents of the function determining the lifetime, the uncertainty in the results is difficult to estimate without a calculation.

In a preferred embodiment, the lifetime consumption is estimated in and for regular time segments. In such a preferred embodiment, the time segments are measured, too and have consequently a small uncertainty which can be considered in the total uncertainty of the lifetime consumption $LC_d(\Delta t)$ in the discrete case.

In an implementation, the propagation of the uncertainty is determined with the help of a truncated Taylor Series around the measured values which is once evaluated to give the most negative deviation and once to give the most positive deviation due to the positive and negative uncertainties of the parameters discussed above.

The lifetime consumption in the discrete case is estimated as follows:

$$LC_d(I_a, T_c, \Delta t) \propto \Delta t C_1^{-1} C_2^{-I_a^2} Q^{-T_c}$$

In this case, the truncated Taylor series results to be:

$$\Delta LC \propto \frac{\partial LC}{\partial C_1}\Delta C_1 + \frac{\partial LC}{\partial C_2}\Delta C_2 + \frac{\partial LC}{\partial I_a}\Delta I_a + \frac{\partial LC}{\partial T_c}\Delta T_c + \frac{\partial LC}{\partial \Delta t}\Delta \Delta t$$

whereby $$\frac{\partial LC}{\partial C_1} \propto \Delta t C_1^{-2} C_2^{-I_a^2} Q^{-T_c} \text{ and } \frac{\partial LC}{\partial C_1}\frac{1}{LC} = C_1^{-1}$$

$$\frac{\partial LC}{\partial C_2} \propto -I_a^2 \Delta t C_1^{-1} C_2^{-I_a^2} Q^{-T_c} \text{ and } \frac{\partial LC}{\partial C_2}\frac{1}{LC} = -I_a^2 C_2^{-1}$$

$$\frac{\partial LC}{\partial I_a} \propto -2I_a \ln(C_2)\Delta t C_1^{-1} C_2^{-I_a^2} Q^{-T_c} \text{ and } \frac{\partial LC}{\partial I_a}\frac{1}{LC} = -2I_a \ln(C_2)$$

$$\frac{\partial LC}{\partial T_c} \propto \ln(Q)\Delta t C_1^{-1} C_2^{-I_a^2} Q^{-T_c} \text{ and } \frac{\partial LC}{\partial T_c}\frac{1}{LC} = -\ln(Q)$$

$$\frac{\partial LC}{\partial \Delta t} \propto C_1^{-1} C_2^{-I_a^2} Q^{-T_c} \text{ and } \frac{\partial LC}{\partial \Delta t}\frac{1}{LC} = \Delta t^{-1}$$

Therefore, the relative uncertainty of the lifetime consumption in the discrete case is $$\frac{\Delta LC}{LC} = \frac{\Delta C_1}{C_1} - I_a^2\frac{\Delta C_2}{C_2} - 2\ln(C_2)I_a^2\frac{\Delta I_a}{I_a} - \ln(Q)T_c\frac{\Delta T_c}{T_c} + \frac{\Delta \Delta t}{\Delta t}$$

In the case of a typical electrolytic capacitor with $T_0=105°$ C., $I_S=1.170$ A, $ESR=0.125\Omega$ at $T_0$ and $I_S$, $\Delta T_m=5.2°$ C., $R_{thjc}=7.01$ K/W, $R_{thca}=23.4$ K/W and $L_0=131400$ h, the constants are $C_1=4\cdot 10^8$, $C2=0.72$, $Q=2^{-1/10}=0.93$.

Assuming, for the sake of an example, an effective ripple current $I_a$ of 1 A and a $T_c$ of 50° C., the relative error is as follows:

$$\frac{\Delta LC}{LC} = \frac{\Delta C_1}{C_1} - \frac{\Delta C_2}{C_2} + 0.7\frac{\Delta I_a}{I_a} + 3.6\frac{\Delta T_c}{T_c} + \frac{\Delta \Delta t}{\Delta t}$$

This shows, that in general, the uncertainty in the temperature measurement dominates the uncertainty in the lifetime consumption in the discrete case. However, with increasing effective ripple current, the uncertainty in $C_2$ and in the effective ripple current becomes more important. $C_2$ has in general only a small uncertainty as it incorporates parameters describing the capacitor and the temperature model which are in general well known.

In a preferred embodiment, the uncertainty propagation is therefore simplified by neglecting the uncertainty in the constants, which is often significantly smaller than the uncertainties of the measurements:

$$\frac{\Delta LC}{LC} = -2\ln(C_2)I_a^2\frac{\Delta I_a}{I_a} - \ln(Q)T_c\frac{\Delta T_c}{T_c} + \frac{\Delta \Delta t}{\Delta t}$$

with the involved constants defined as follows, the sign of the logarithm-terms is negative:

$$C_2 = 2^{-\frac{ESR}{10K}(2R_{thjc}+R_{thca})}, Q = 2^{-\frac{1}{10K}}$$

$$\ln(C_2) = -\frac{ESR}{10K}(2R_{t\,jc}+R_{t\,ca})\ln(2), \ln(Q) = 0.1K\ln(2)$$

Rewritten, the difference in the lifetime consumption cause by small changes in the effective ripple current $I_a$, the case temperature $T_c$ and the time segment $\Delta t$ is therefore:

$$\frac{\Delta LC}{LC} = \frac{\ln(2)}{5K}ESR(2R_{thjc}+R_{thca})I_a^2\frac{\Delta I_a}{I_a} + \frac{\ln(2)}{10K}T_c\frac{\Delta T_c}{T_c} + \frac{\Delta \Delta t}{\Delta t}$$

Especially in cases where the time segments are long, the relative uncertainty in the time segments can be neglected compared to the relative uncertainties of effective ripple current and temperature which increases with increasing length of the time segments due to the changes in these parameters:

$$\frac{\Delta LC}{LC} = \frac{\ln(2)}{5}ESR(2R_{thjc}+R_{thca})I_a^2\frac{\Delta I_a}{I_a} + \frac{\ln(2)}{10}T_c\frac{\Delta T_c}{T_c}$$

which further simplifies the analysis.

As the time segments are only part of the lifetime consumption calculation in the discrete case, the uncertainty of the lifetime consumption in the continuous case can be estimated with the above given formulas by setting the relative uncertainty in the time segment to zero.

By using once the estimated differences with a positive sign and once the estimated difference with a negative sign, the positive and negative difference to the estimated lifetime consumption which is caused by the uncertainties in the measurements can be estimated.

In an implementation, the uncertainty in positive and negative direction of the lifetime consumption is determined for every time segment Δt in the discrete case.

The total lifetime consumption after a number of n time segments is the sum of the lifetime consumptions in these time segments:

$$LC_{total}(t) = \sum_n LC(\Delta t)_n$$

The uncertainty of the total lifetime consumption after a number of n time segments Δt is the sum of the respective uncertainties of the lifetime consumption during each of these segments:

$$\Delta LC_{total}(t) = \sum_n \Delta LC(\Delta t)_n$$

In a preferred embodiment, the estimated differences with a positive sign are assumed to equal the absolute values of the estimated differences with a negative sign. In this case, only one uncertainty of the lifetime consumption is calculated per time segment and there is also only one estimate of the total lifetime consumption.

In a preferred embodiment the controller of the apparatus according to the present application determines the lifetime consumption in regular time segments and in an implementation, the controller of the apparatus according to the present application determines the lifetime consumption and its uncertainty in regular time segments. Every time segment is represented by a mean temperature and a mean effective current. In an implementation, the mean temperature and the mean effective current or the mean input voltage are averages over all suitable measurements obtained during the time interval. The total lifetime consumption is, in this embodiment, the sum over all previous lifetime consumptions. In an implementation, the total lifetime consumption is determined and stored.

Determining the lifetime consumption in regular time segments which are sufficiently small allows the use of the above-mentioned formulas and methods to determine the lifetime consumption at a constant case temperature and a constant effective ripple current also in situations in which the case temperature and the effective ripple current varies over time. The time segments are chosen in such a way that the uncertainty caused by the assumption of a constant situation is acceptable.

In one preferred embodiment, the above discussed formula to estimate the uncertainty can be used to set a reasonable time segment length, whereby a rate of change of the case temperature $T_C$ and the effective ripple current $I_a$ are estimated as well as the measurement uncertainty of the time segment ΔΔt. The user may specify the acceptable uncertainty in the total lifetime consumption. If it is further possible to estimate typical values of case temperatures and effective ripple currents, the formula to estimate the uncertainty of the lifetime consumption of a given time segment may be reformulated to be a quadratic equation for the time segment Δt.

However, in an implementation, the length of a time segment is set to a fraction of a typical time scale for the apparatus at hand. In an implementation, the time segment Δt is set to 1 h, 0.1 h or 0.01 h or $1/100^{th}$ of the duration of a usage cycle.

The use of regular time segments facilitates the control and the evaluation of the lifetime consumption of the one or more electrolytic capacitors which are part of the apparatus according to the present application.

However, in other embodiments, the length of the time segments can vary. In a preferred embodiment, shorter time segments are used in a first mode and time segments of a different length are used in a second mode whereby the lengths of the time segments in the second mode are influenced by the observations made during the application of the first mode. In an implementation, the time segments in the second mode are longer than the time segments of the first mode if the lifetime consumption of subsequent time segments of the first mode was essentially constant while the time segments of the second mode are shorter than the time segments of the first mode if the lifetime consumption of subsequent time segments of the first mode changed often by more than a predefined amount. In this embodiment, the apparatus defines by itself a reasonable length of the time segments. This embodiment is therefore preferred for cases where the use of the apparatus is unknown to the manufacturer.

In one embodiment, there is only one measurement done during every time segment and this is a single reading of the case temperature. In this case, the mean temperature is the result of this measurement and, if needed, the mean effective ripple current is estimated. This embodiment needs very few measurements and needs therefore only little computing power.

In another embodiment, there is in addition a single measurement of an output power, a current or an input voltage in every time segment and this measurement is used to estimate the mean effective ripple current. This embodiment needs also very few measurements but allows more precise lifetime consumption estimations for apparatuses where output power, current and/or input voltages are a priori unknown and difficult to estimate.

In another embodiment, the case temperature is measured multiple times during each time segment. There are, for example, ten case temperature measurements acquired during a time segment and the mean case temperature is determined by calculating the arithmetic mean of these values.

Similarly, the mean effective ripple current can be evaluated using more than one measurement. However, the multiple measurements can be used in different ways: In one embodiment, the ripple current is measured directly and the multiple measurements are analyzed to determine the involved frequencies and in this case, multiple measurements result in only a single effective ripple current value which is then assumed to be the mean effective ripple current value. In another embodiment, every measurement or sets of measurements of a current, the input voltage and/or an output power are used to determine multiple effective ripple current values during a single time segment, for example by using a look-up-table and knowledge about the number of input phases and the output mode. In this case the arithmetic mean of the multiple effective ripple current values determined during a single time segment can be used as mean effective ripple current. In another embodiment, the arithmetic mean of the measurement values, for example the input voltage, the current and/or the power, is determined before the effective ripple current based on this mean value is determined, for example by using the appropriate lookup-table, and used as mean effective ripple current.

Before calculating the arithmetic mean of a set of case temperature measurements and/or current, power of voltage measurements or a set of effective ripple currents, a filter may be applied to remove obviously faulty data points or to apply higher weights to data points of high quality.

In a preferred embodiment of an apparatus according to the present application, the user can specify a usage cycle. The usage cycle is expected to be repeated in the future.

The controller of this embodiment determines the lifetime consumption and in an implementation, the controller of this embodiment determines the lifetime consumption and its uncertainty either in time segments or continuously during this usage cycle. By integrating or adding the lifetime consumptions of the usage cycle, this controller determines the usage cycle lifetime consumption and in an implementation, this controller determines the usage cycle lifetime consumption and its uncertainty.

The usage cycle lifetime consumption ($LC_{uc}$) is used by the controller to determine a preliminary predicted lifetime ($L_{pp}$) by extrapolating the total lifetime consumption ($LC_{total}(t)$) linearly.

In an implementation, the slope of this linear extrapolation is quotient of the usage cycle lifetime consumption ($LC_{uc}$) and the duration of the usage cycle ($\Delta t_{uc}$). In an implementation, the function used for the linear extrapolation comprises the beginning of the usage cycle ($t_b$) and the total lifetime consumption at the beginning of the usage cycle ($LC_{total}(t_b)$).

The preliminary predicted lifetime ($L_{pp}$) is the duration between the beginning of the life of the capacitor and the time at which the extrapolation of the total lifetime consumption ($LC_{total}(t)$) reaches the value which indicates the end of the lifetime. This value is 1, if the lifetime consumption is defined as fraction of the lifetime or 100% if the lifetime consumption is defined as percentage of the lifetime.

In an implementation, if the lifetime consumption is defined as fraction of the lifetime, the preliminary predicted lifetime is calculated as follows:

$$L_{pp} = (1 - LC_{total}(t_b))\frac{\Delta t_{uc}}{LC_{uc}} + t_b$$

In an implementation, the controller comprises in addition a clock counting the age (t) of the one or more electrolytic capacitors.

The residual lifetime $L_R(t)$ is estimated by the controller to be the difference between the age (t) of the one or more electrolytic capacitors and the smaller one of the preliminary predicted lifetime ($L_{pp}$) and the maximum age of the electrolytic capacitor $t_{max}$.

$$L_R(t) = \min(L_{pp}, t_{max}) - t$$

In an apparatus without a clock counting an age of the one or more electrolytic capacitors, the age can be determined by the sum of all previous time segments in the discrete case or by the integral of 1 over the time in the continuous case.

In an implementation, the residual lifetime $L_R(t)$ is returned together with its uncertainty $\Delta L_R(t)$. In an implementation, the uncertainty $\Delta L_R(t)$ is determined considering the uncertainty in the determination of the age $\delta t$ of the one or more capacitors, the uncertainty in the maximum age $\Delta t_{max}$ and the uncertainty in the preliminary predicted lifetime ($\Delta L_{pp}$) by using a truncated Tayler series comprising only the linear terms. In an implementation, the uncertainty in the preliminary predicted lifetime ($\Delta L_{pp}$) is estimated in the same way by considering the uncertainty in the usage cycle lifetime consumption $\Delta LC_{uc}$ and in the duration of a usage cycle ($\Delta \Delta t_{uc}$) as well as the age ($\Delta t_b$) and the lifetime consumption ($\Delta LC_{total}(t_b)$) at the beginning of the recorded usage cycle.

$$\Delta L_R(t) = \begin{cases} \Delta L_{pp} - \delta t & \text{if } L_{pp} \leq t_{max} \\ \Delta t_{max} - \delta t & \text{otherwise} \end{cases}$$

$$\Delta L_{pp} = (L_{pp} - t_b)\left(\frac{\Delta \Delta t_{uc}}{\Delta t_{uc}} - \frac{\Delta LC_{uc}}{LC_{uc}} - \frac{\Delta LC_{total}(t_b)}{1 - LC_{total}(t_b)}\right) + \Delta t_b$$

The greatest positive uncertainty of the preliminary predicted lifetime occurs if the positive uncertainties of the duration of the usage cycle ($\Delta \Delta t_{uc}$) and the age at the beginning of the usage cycle ($\Delta t_b$) occur together with the negative uncertainties of the usage cycle lifetime consumption $\Delta LC_{uc}$ and the lifetime consumption ($\Delta LC_{total}(tb)$) at the beginning of the recorded usage cycle. The most negative uncertainty of the preliminary predicted lifetime occurs if the negative uncertainties of the duration of the usage cycle ($\Delta \Delta t_{uc}$) and the age at the beginning of the usage cycle ($\Delta t_b$) occur together with the positive uncertainties of the usage cycle lifetime consumption $\Delta LC_{uc}$ and the lifetime consumption ($\Delta LC_{total}(t_b)$) at the beginning of the recorded usage cycle.

In a preferred embodiment, the residual lifetime is expressed in units of the duration of the recorded usage cycle ($\Delta t_{uc}$):

$$L_R(t) = \min\left(\frac{1 - LC_{total}(t_b)}{LC_{uc}} - \frac{t - t_b}{\Delta t_{uc}}, \frac{t_{max} - t}{\Delta t_{uc}}\right)$$

If the usage cycle was, as assumed, repeated over and over again since it was recorded, the expression $$\frac{t - t_b}{\Delta t_{uc}}$$

is simply the number of usage cycles which occurred since the beginning of the recorded usage cycle.

This embodiment allows the user to obtain a residual lifetime estimation in the units of a usage cycle. This number is often more comprehensive than a number of hours as the user will most likely want to schedule maintenance and repairs to take place between usage cycles. Further, counting usage cycles yields, in most cases, a result with a smaller uncertainty compared measuring the current time and determining the duration of a usage cycle.

Most apparatuses, especially power supplies, are used in a very similar way over and over again. For example, a machine using the power supply might be switched on every morning and off every evening or the load on the machine might vary in a pattern which repeats every day, every week or every hour or in a time frame needed to complete a specific task.

The usage cycle is such a repeated pattern in the way the apparatus according to the present application is used.

Defining and recording such a usage cycle improves the quality of the estimation of the residual lifetime: Over the course of a usage cycle, the lifetime consumption per unit time may change significantly. If the residual lifetime is estimated by interpolation of an average over an arbitrary timespan, there is a great risk that this arbitrary timespan comprises to many time segments with a high lifetime consumption or with a very low lifetime consumption. Both will result in unrealistic estimates of the residual lifetime.

By allowing the user to define or record a specific usage cycle, a meaningful prediction of the residual lifetime can be produced by using the determined usage cycle lifetime consumption observed during the usage cycle.

In addition, this embodiment allows the user to get an updated prediction if the usage cycle is changed, for example when the apparatus is used for another purpose: Once the controller has registered the new usage cycle, the previous lifetime consumption does not influence the slope of the future extrapolation.

In a preferred embodiment, subsequent usage cycles are used to improve the estimate of the usage cycle lifetime consumption. In this embodiment, the controller determines continuously if the measurements are well represented by the defined usage cycle. If this is the case, the observed usage cycle lifetime consumption is used to calculate a mean value of the usage cycle lifetime consumption and it is this mean usage cycle lifetime consumption which is used to estimate the residual lifetime.

In another preferred embodiment, the controller determines if the usage cycle lifetime consumption develops in a systematic way from usage cycle to usage cycle although all usage cycles are well represented by the defined usage cycle. In this case, the controller may use the observed lifetime consumption of the last measured usage cycle or the mean over the last few measured usage cycles to estimate the residual lifetime. This embodiment allows to automatically improve the estimate of the residual lifetime in cases of slowly changing background condition such as for example seasons causing different ambient temperatures or heating caused by aging of surrounding components. In order to detect the systematic development, in an implementation, the controller stores the usage cycle lifetime consumption of all detected usage cycles.

In an implementation, measurements are well represented by the recorded or defined usage cycle, if the change of the case temperature with time is similar to the one of the recorded or defined usage cycle while greater differences are accepted in the absolute values of the measurements. In an implementation, the user may set a first threshold regarding the change of the case temperature measurements and/or the ripple current estimate and a second threshold regarding the absolute values of the case temperature, the effective ripple current and/or the lifetime. In this embodiment, the controller assumes that an observed usage cycle is well represented by the recorded or defines usage cycle if the difference in the change is below the first threshold and if the difference in the absolute value is below the second threshold.

In an implementation, the time segments $\Delta t$ used while determining the lifetime consumption of a usage cycle may be smaller than the time segments used during the subsequent use of the apparatus. Thereby, the uncertainty in the lifetime consumption of the usage cycle used for the definition can be lower than the uncertainty in the subsequent usage cycles. In such an embodiment, the determination of the lifetime consumption in the subsequent usage cycles can be used mainly to determine that the subsequent usage cycle is well represented by the recorded usage cycle.

In an implementation, all time segments are integrated to yield the total lifetime consumption. Specifically, also time segments which are not considered to be part of a usage cycle or which are part of previously defined usage cycles are counted to the total lifetime consumption. Thereby, an incomplete usage cycle influences only the total lifetime consumption but not the lifetime consumption per usage cycle.

In a preferred embodiment, the controller records the case temperature measurements or the estimated lifetime consumptions of the usage cycle during its specification and in an implementation, the controller records the case temperature measurements or the estimated lifetime consumptions and the estimated effective ripple current of the usage cycle during its specification. These recorded data sequences are compared to the data sequences produced during times which are assumed to be repetitions of the usage cycle. In this preferred embodiment, the controller issues a signal to the user if it detects that a deviation between the recorded and the measured data is greater than a threshold. Thereby, the user is warned about a loss in quality in the residual lifetime estimate. In an implementation, the controller issues a signal asking the user to specify a new usage cycle.

In a further preferred embodiment, the controller compares the stored usage cycle lifetime consumption and its uncertainty with the current lifetime consumption during the duration of the defined usage cycle. If this detected lifetime consumption differs by more than the estimated uncertainty from the stored usage cycle lifetime consumption and if this happens for more than a preset time, the controller issues a warning and suggests to record and define a more suitable usage cycle.

In a particularly preferred embodiment, during times in which the controller detects a significant difference between the recorded and produced data sequences, the controller tries to shift the recorded data sequence in time in order to find a phase shift between current situation and recorded data sequence which minimized the difference. If the deviation between the recorded, but shifted, and the measured data is less than the threshold, the preliminary predicted lifetime and/or the residual lifetime are updated to include the age and the total lifetime consumption at the point in time at which the produced data sequence is well represented by the recorded usage cycle again and In an implementation, the controller stops issuing the warning.

In a preferred embodiment, the extrapolation of the preliminary predicted lifetime and/or the residual lifetime are regularly updated such that the latest available data about age and total lifetime consumption are considered by the extrapolation.

In the preferred case of a linear extrapolation, the preliminary predicted lifetime and/or the residual lifetime is in this embodiment estimated with the following formula wherein $t_u$ is the time of the latest available data about age and total lifetime consumption.

$$L_{pp} = (1 - LC_{total}(t_u)) \frac{\Delta t_{uc}}{LC_{uc}} + t_u$$

$$L_R(t) = \min(L_{pp}, t_{max}) - t$$

By updating the residual lifetime and/or the preliminary predicted lifetime from time to time, in an implementation, after the duration of the specified usage cycle, the controller can consider the influence of single events on the residual lifetime. For example, a skipped or aborted usage cycle will increase the residual lifetime and the update according to this embodiment allows to consider this effect.

In a preferred embodiment, the controller comprises an interface and stores the case temperature for every time segment where these values are obtained, in an implementation, the controller stores the case temperature, the effective ripple current and the lifetime consumption for every time segment where these values are obtained. These values or a statistic derived from them can be exported through the interface. In one embodiment, the interface is an IO-link.

By considering not only the lifetime consumption but also the values of the case temperature and the effective ripple current used to estimate the lifetime consumption, the user can detect and analyze long term changes in the apparatus. For example, a long term change in the case temperature may be caused by the seasons but also by a degrading of surrounding components in the apparatus which provide more heat that previously. Further, the user may use the data to optimize the use of the apparatus to increase its lifetime.

Instead of storing and exporting every single data value, exporting and storing statistics derived from them or a mixture of both can safe memory and allows a faster overview of the desired properties. For example, only a fixed number of datasets is stored while the earlier history of the capacitor may be documented by storing for every usage cycle only the type of usage cycle and a deviation from it or the mean case temperature of the whole usage cycle. The data may also be binned to produce histogram data, for example storing the number of time segments with a given lifetime consumption or the number of time segments with a certain case temperature or a certain assumed effective ripple current. Another statistic which may help to estimate the impact of the choice of the length of the time segments may be a histogram showing the difference in the lifetime consumption between subsequent time segments.

In an implementation, the interface can also be used to customize the evaluation of the lifetime consumption, the residual lifetime and/or the uncertainty estimations. For example, the user may specify the method to estimate the effective ripple current or update the constants describing the capacitors and the thermal model. He may choose a different length of a time segment, define usage cycles and thresholds, set the time interval in which the residual lifetime is updated, and adapt the formula for the extrapolation of the total lifetime.

In a preferred embodiment, the controller comprises, besides the interface a button which allows to specify the usage cycle and a display or a light indicator to indicate that amount of the residual lifetime. For example, the usage cycle may be defined by pushing the button once at the beginning and twice at the end of the usage cycle and the light indicator may glow in green as long as the residual lifetime is more than 25% of the shorter one of the preliminary predicted lifetime and the maximum age and turn to orange once this fraction reduces to 10% and to red once there is no residual lifetime anymore. A flashing light indicator may signal that the currently used usage cycle appears to be a poor representation of the current usage of the apparatus.

Other advantageous embodiments and combinations of features come out from the detailed description below and the entirety of the claims.

BRIEF DESCRIPTION OF DRAWINGS

The drawings used to explain the embodiments are as follows:

FIG. 4 is an example of the effective ripple current and case temperature of an electrolytic capacitor during a single usage cycle;

FIG. 5a is the estimated lifetime, lifetime consumption and total lifetime consumption of an electrolytic capacitor which is subject to the effective ripple current and the case temperature shown in FIG. 4;

FIG. 5b is an enlarged view of the lifetime consumption and the total lifetime consumption shown in FIG. 5a;

FIG. 6 shows the total lifetime consumption and the estimated residual lifetime which is updated after a second usage cycle was detected and defined;

In the figures, the same components are given the same reference symbols.

DESCRIPTION OF EMBODIMENTS

Figure 1:
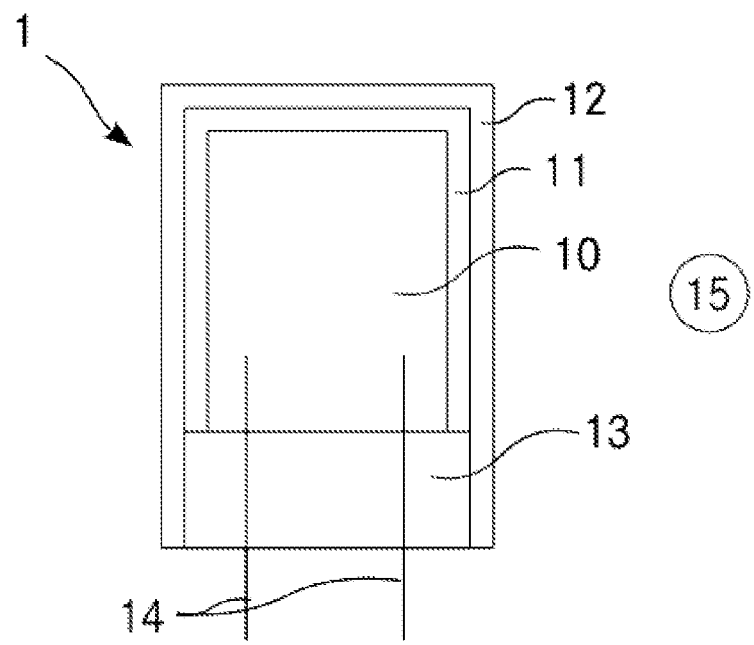
FIG. 1 is a schematic diagram of an electrolytic capacitor.

FIG. 1 shows an electrolytic capacitor 1. The core 10 is formed by two conductor surfaces separated by an insulator. In one example the core is formed by a rolled sandwich of two aluminium foils separated by impregnated paper as insulator. The paper is impregnated with an electrolyte. The core 10 is surrounded by the case 11 on all but one side. The open side is closed by a sealing 13, which is typically made of rubber. Two terminal leads 14, one being connected to one of the conductors in the core 10 and the other one being connected to the other one of the conductors, are lead through the sealing 13. The outside of the case 11 and part of the sealing 13 is protected by an insulating sleeve 12. The sleeve 12 is typically only a thin plastic layer onto which information such as the type of the capacitor, the capacitance and the polarity are printed. FIG. 1 shows also the "ambient" 15 of the thermal model of the electrolytic capacitor 1.

The lifetime of an electrolytic capacitor 1 is typically restricted by chemical degradation of the electrolyte and its evaporation. An electrolytic capacitor has therefore a usage independent maximum age 53 and a temperature, and therefore usage, dependent lifetime 43, which can be estimated. In most cases of electrolytic capacitors which are in use, the lifetime 43 is shorter than the maximum age 53.

At the end of the lifetime of an electrolytic capacitor 1, typically, its capacitance reduces and its impedance and its equivalent series resistance increases. The increase in the equivalent series resistance causes a greater heating. In an apparatus, the aging capacitor 1 differs more and more from the design specification. The user may notice an increase in noise and/or a periodic lack of power depending on the apparatus and the function in which the capacitor 1 is used. The lifetime of an electrolytic capacitor 1 is defined as the time during which its properties remain in acceptable interval around the nominal values.

The lifetime estimate of an electrolytic capacitor 1 depends on its core 10 temperature. However, if one would like to measure the core temperature directly, a sensor would have to be inserted through the sealing 13. This weakens the sealing 13 and accelerates the evaporation and therefore the maximum age 53 of the capacitor 1 reduces. In addition, the capacitors 1 are in general constructed to be as compact as possible. Consequently, there is little or no space for a temperature sensor 32 in a commercially available electrolytic capacitor 1.

Figure 2A:
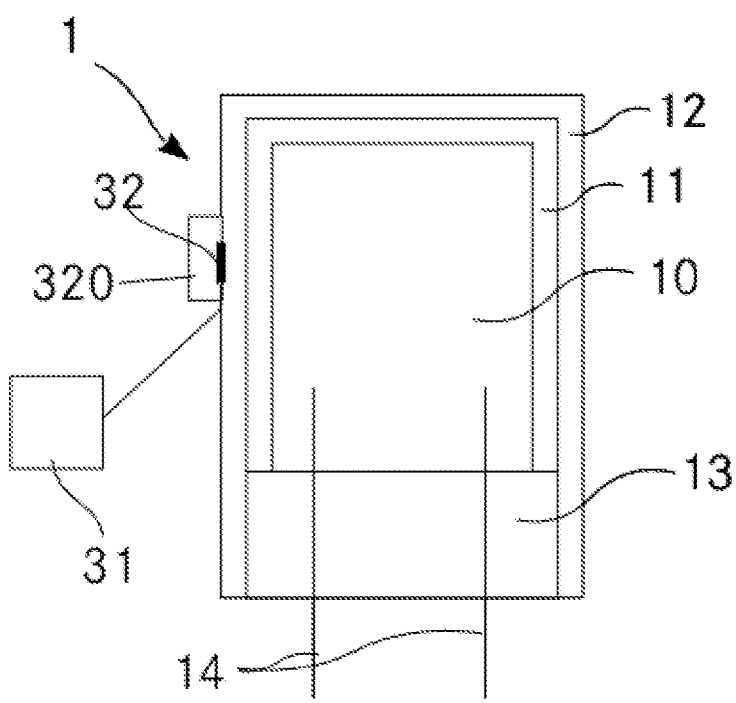
FIG. 2a, 2b, 2c are illustrations of the case temperature measurement and the location of the temperature sensor according to the present application.

According to one embodiment of the present application, which is shown in FIG. 2a, the temperature sensor 32 is therefore mounted on the case 11 of the electrolytic capacitor 1, respectively directly on the sleeve 12. The sleeve 12 is sufficiently thin to be treated as part of the case 11 in the temperature model. In this embodiment the temperature sensor is thermally insulated from the ambient 15 by a layer 320 of thermally insulating material. Thereby, the temperature of the temperature sensor 32, and as a result the measured value, is dominated by the temperature of the case 11.

The layer 320 of the thermally insulating material covers only the sensor and its immediate surrounding which is an area small compared to the total area of the case 11. This allows the capacitor 1 to dissipate heat to the ambient 15, minimizing the impact caused by the temperature measurements.

The temperature sensor 32 is connected to a controller 31 which uses the case temperature measurements to estimate the lifetime of the capacitor. In the case shown at hand, the temperature sensor 32 transmits its data via a cable. In other embodiments, a wireless transmission can be used.

Figure 2B:
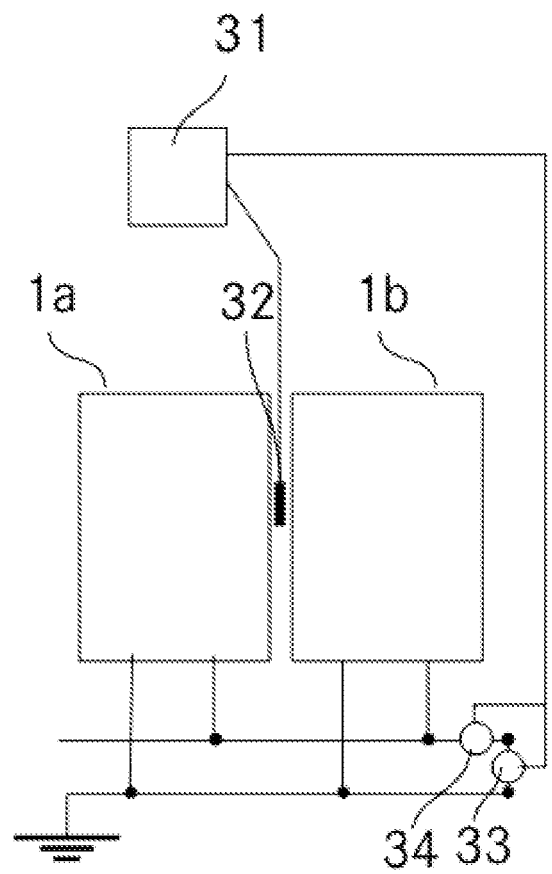
Figure 2C:
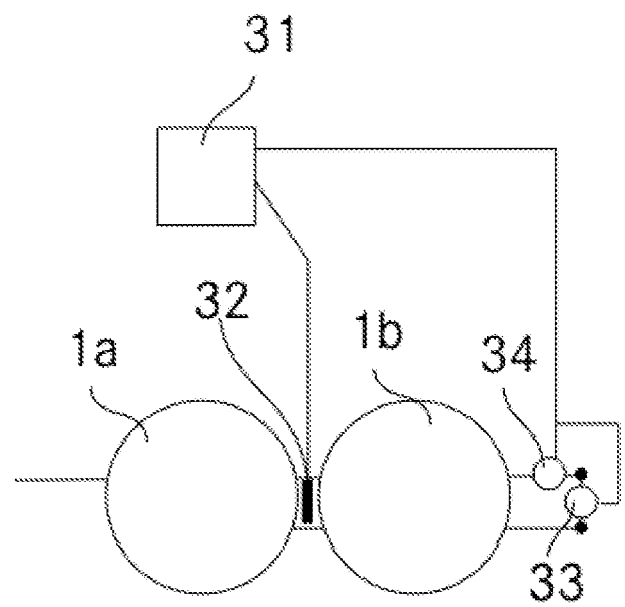

According to one embodiment of the present application, which is shown in FIGS. 2b and 2c, the temperature sensor 32 is mounted between two the electrolytic capacitors 1a, 1b which are connected in parallel. The two electrolytic capacitors 1a and 1b are of the same type and the same size and, as being connected in parallel, subject to the same internal heating and, as being located adjacent to each other, subject to the same ambient conditions. FIG. 2b shows the situation from the side and FIG. 2c shows the situation from the top. The temperature sensor 32 is, seen from all sides, arranged between the two capacitors. As both capacitors 1a and 1b produce the same amount of heat, the temperature between them will be equal to the common case temperature. Instead of an added insulating layer, it is the second capacitor which protect the temperature sensor 32 from environmental effects such as local heat sources or sinks. The temperature sensor may be glued on the sleeve 12 of one of the capacitors 1a, 1b in a region which will be between the first and the second capacitor 1a, 1b in the apparatus.

In the embodiments shown in FIGS. 2b and 2c, there are, in addition to the temperature sensor 32, an ammeter 34 and a voltmeter 33 which measure the current and the voltage at the capacitors 1a and 1b. The data is also transmitted to the controller 31. The controller 31 uses the current and/or voltage measurements to estimate the effective ripple current flowing through the capacitors 1a and 1b.

In the embodiment according to FIG. 2a, the effective ripple current is estimated based on the knowledge of the number of phases of the source, the output mode and the power needed on the output side. In an implementation, this information is shared between a switching controller which is used to control switches of the circuitry of the apparatus and the controller 31 which estimated the lifetime. In an implementation, the switching controller and the controller 31 are a single unit which controls the switching of switches of the circuitry of the apparatus as well as estimates the lifetime consumption and the residual lifetime of the electrolytic capacitors.

Figure 2D:
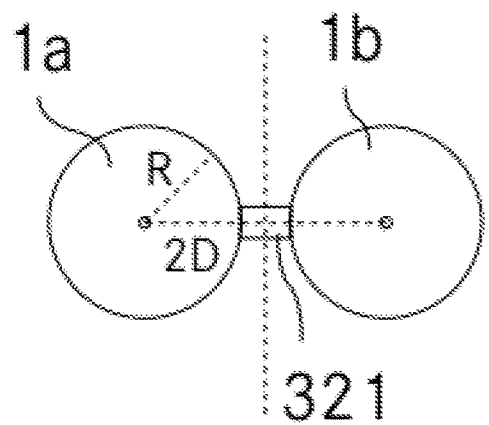
FIG. 2d, 2e are illustrations of the volume for a placement of the temperature sensor according to the present application.
Figure 2E:
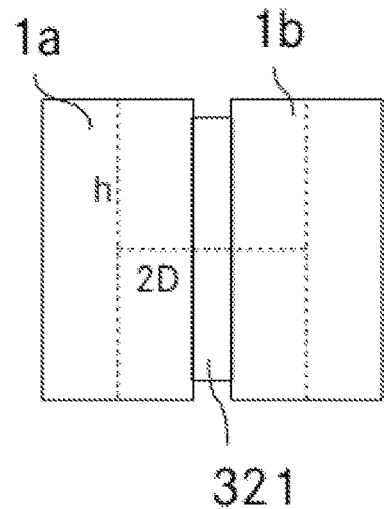

FIGS. 2d and 2e illustrate the volume in which a temperature sensor 32 is arranged in the embodiment according to FIGS. 2b and 2c in order to be thermally isolated from the ambient 15. FIG. 2d shows the two capacitors 1a, 1b from above. Dashed lines indicate the radius of one of the capacitors and the connection line between them as well as the direction perpendicular to the connection line and to the longitudinal axis of the capacitors. The cubical volume 321 into which the temperature sensor 32 is arranged is shown as small rectangle arranged between the two capacitors in this projection. FIG. 2e shows the situation from the side. The two capacitors 1a and 1b appear as rectangles in this perspective having both the same height h which is indicated in this example along their longitudinal axis. The distance between them is the same as in FIG. 2d. The cubical volume 321 into which the temperature sensor 32 is arranged is shown as elongated rectangle between the two capacitors in this projection. Although it is hardly visible in the example of FIGS. 2d and 2e, parts of the capacitors extend into the cubical volume and it would be on this part of the surface where the temperature sensor would be glued on.

Figure 3:
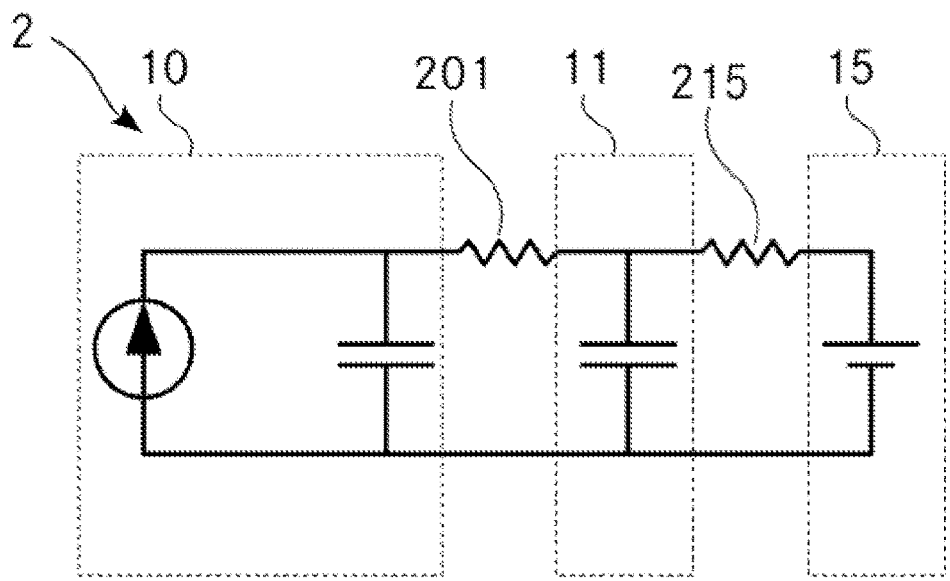
FIG. 3 is the thermal model of the capacitor.

FIG. 3 shows a thermal model 2 on which the lifetime estimate according to the present application is based. The model describes three sections: There is the core 10 of the capacitors, the case 11 and the ambient 15. The core 10 and the case 11 are modelled as heat capacitances. The ambient 15 is modelled as voltage source-equivalent providing a constant, ambient temperature. The core 10 comprises in addition and parallel to the heat capacitance, a power source-equivalent representing the heat source created by the power loss in the core 10 during use. The interfaces between the three sections are modelled by thermal resistors. The first one of these interfaces is between the core 10 and the case 11 and it has the thermal resistance between core and case 201 $R_{thjc}$. The second one of these interfaces is between the case 11 and the ambient 15 and it has the thermal resistance between case and ambient 215 $R_{thca}$.

The parameters of this thermal model 2 can be determined by suitable experiments with the electrolytic capacitors in a controlled environment. For example, the case temperature can be determined in reaction to different effective ripple currents and different ambient temperatures.

In order to estimate the lifetime consumption in the method at hand a steady state situation regarding the temperature is assumed and therefore only the thermal resistance values between the core and the case 201 $R_{thjc}$ and between the case and the ambient 215 $R_{thca}$ as well as the heat source of the effective ripple current are needed.

Figures 4, 5A, 5B:
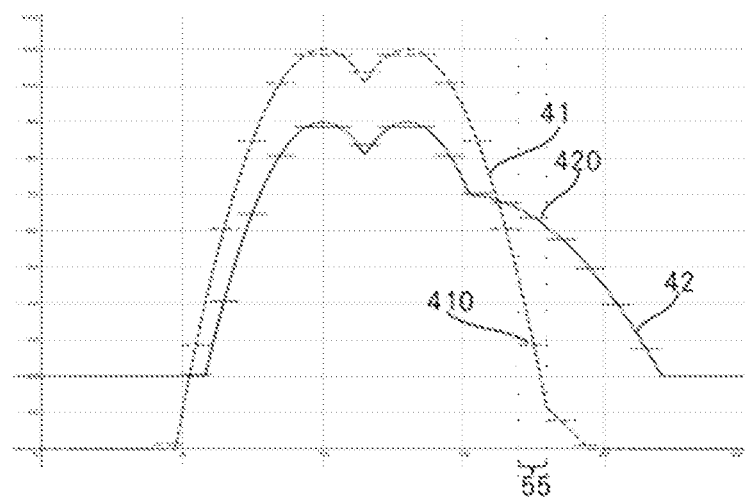

FIG. 4 shows an example of development of the case temperature 42 and the effective ripple current 41 over time during a usage cycle. Case temperature 42 and effective ripple current 41 are given in arbitrary units and plotted on the common y-axis. The time evolves along the common x-axis.

While the apparatus in which the electrolytic capacitor at hand is used is turned off, the case temperature equals the ambient temperature. Once the apparatus is turned on, a ripple current appears and starts to produce heat which increases the temperature of the core. The heat is conducted to the case and the temperature increase is detected. The ripple current varies during use and finally decreases to zero when the apparatus is turned off. In the absence of heating, the conductor cools until the case temperature equal the ambient temperature.

In a preferred embodiment, the lifetime estimate and/or the consumed lifetime are derived using a mean temperature 420 and/or a mean effective ripple current 410 to represent the situation in a given time segment 55. In an implementation, the time segments 55 are chosen such that the change in temperature 42 and effective ripple current 41 is small. In FIG. 4 large time segments 55 were chosen, mainly to illustrate the principle. However, even these large time segments 55 give a rough representation of the development of the case temperature and the effective ripple current and can be used, for example, to ensure that a specified usage cycle is in progress.

In the case illustrated in FIG. 4, the mean temperature 420 and the mean effective ripple current 410 values are the arithmetic averages of all measurements in the time segment 55. In other embodiments however, the mean temperature 420 and the mean effective ripple current 410 are otherwise evaluated representative values for the time segment 55 in question. For example, case temperature 42 and effective ripple current 41 are only measured once during each time segment 55.

FIG. 5a shows the estimated lifetime 43 based on the case temperature 42 and the effective ripple current 41 shown in FIG. 4. FIG. 5b shows the lifetime consumption 44 and the total lifetime consumption 45. While the estimated lifetime 43 shown in FIG. 5a is given in time units, the lifetime consumption 44 and the total lifetime consumption 45 are given as a fraction or as a percentage of the total lifetime of the capacitor. In the case shown, the lifetime consumption 44 is expressed as fraction of the total lifetime of the capacitor per unit time and the total lifetime consumption is expressed as fraction of the total lifetime of the capacitor. Therefore, if the total lifetime consumption 45 reaches the value 1 the capacitor has reached the end of its preliminary predicted lifetime and will likely start to show degradation effects.

The lifetime consumption 44 is proportional to one time unit over the estimated lifetime 43 and the total lifetime consumption 45 is the integral of the lifetime consumption 44 over time. Consequently, the total lifetime consumption 45 at the end of the first usage cycle can be used as an estimate for the usage cycle lifetime consumption. If a usage cycle is defined later in the service life of an electrolytic capacitor, the usage cycle lifetime consumption is the difference between the total lifetime consumption 45 at the end of the usage cycle and the total lifetime consumption 45 at its beginning.

FIGS. 5a and 5b show the first usage cycle of the electrolytic capacitor: The total lifetime consumption 45 is zero at the beginning of the illustrated time interval. If the electrolytic capacitor at hand would have experienced previous usage cycles, the total lifetime consumption 45 would have a value different from zero at the beginning of the illustrated time interval. However, the curves of the lifetime estimate 43 and the lifetime consumption 44 would be the same as the ones shown.

In FIGS. 5a and 5b the continuous lines show the lifetime estimate 43, the lifetime consumption 44 and the total lifetime consumption 45 evaluated based on the continuous measurements of case temperature 42 and effective ripple current 41. The horizontal lines illustrate the values obtained by using the mean temperature 420 and the mean effective ripple current 410 as assumed constant values for the time segment 55 in question. While the choice of the large time segments 55 causes some deviation from the exact value of the total lifetime consumption 45 in times where the lifetime consumption 44 changes, the difference is at the end of the usage cycle sufficiently small to be usable.

In order to allow a comparison between the error caused by using the mean values 420 and 410 and the error cause by an uncertain case temperature measurement, FIG. 5b shows in addition the total lifetime consumptions for a case temperature which is 5% lower 10 (451b) or 5% higher (451a) than the one shown in FIG. 4. As FIG. 4 shows a case with 20° C. ambient temperature, a 5% error is +/−1° C. while the apparatus is turned off. Obviously, if such an uncertainty in the temperature would be accepted, the uncertainty in the total lifetime consumption is even after a single usage cycle about half of the value itself. This illustrates that a precise temperature measurement is of key importance for a useful lifetime consumption estimation and even more for a useful prediction of the residual lifetime.

Figure 6:
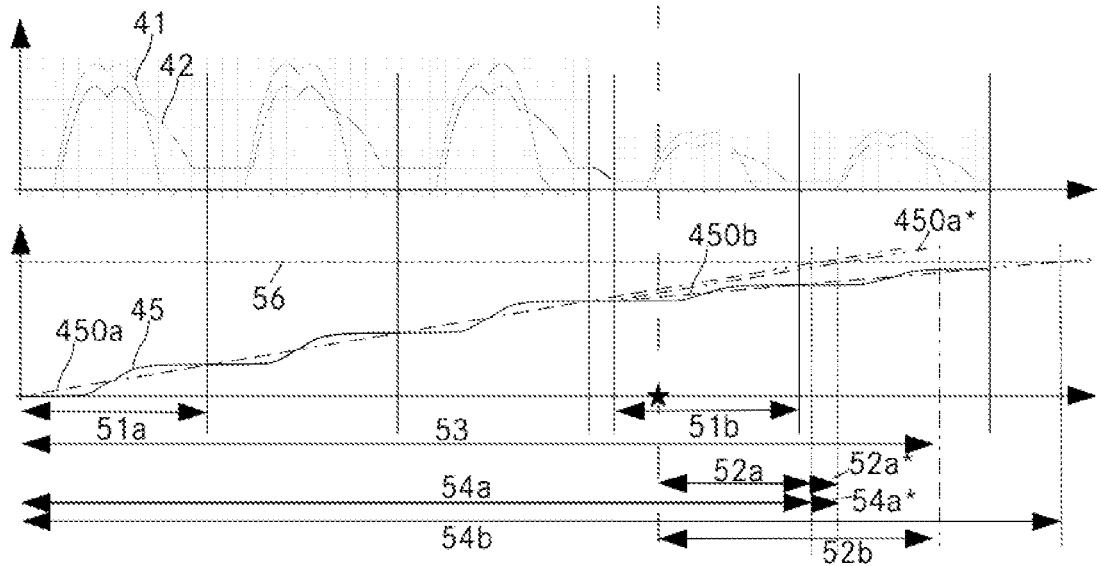
FIG. 6 is an example of the effective ripple current and case temperature of an electrolytic capacitor over many usage cycles and including a change in the usage cycle. In addition.

FIG. 6 illustrates the lifetime estimation and the determination of the residual lifetime 52a, 52b over a plurality of usage cycles 51a, 51b.

The upper diagram of FIG. 6 shows the case temperature measurements 42 and the effective ripple current values 41 over time. In the beginning of its service life, the capacitor is used in an apparatus with a first usage cycle 51a. Later, the apparatus is used differently and has therefore a second usage cycle 51b. In the case shown here, the length of the first and the second usage cycle 51a and 51b is similar but the amplitude of case temperature and effective ripple current is differently. In other embodiments, the amplitudes may be similar but the durations of the usage cycles differs. In further embodiments, the usage cycles differ in the amplitude and/or the shape of the temperature and/or the effective ripple current curve and in addition in their durations. There is also a time during which the case temperature development and the effective ripple current development differ from both, the first and the second usage cycle.

The lower diagram of FIG. 6 shows the total lifetime consumption 45 and the maximum age 53 of the capacitor. The total lifetime consumption 45 is given in a fraction of the total lifetime and a dashed horizontal line indicates the "1". The time at which an extrapolation of the total lifetime consumption 45 crosses this dashed line is the preliminary predicted lifetime 54a, 54b. The preliminary predicted lifetime 54a, 54b can be greater or smaller than the maximum age 53 of the capacitor. The maximum age 53 is the age at which the capacitor in question starts to fail because of usage-independent aging processes such as the evaporation of electrolyte through the sealing 13. The residual lifetime 52 at the point in time, in FIG. 6 as an example marked with a star, is the time left until either the maximum age 53 or the preliminary predicted lifetime 54a, 54b is reached, whichever comes first.

In FIG. 6 the preliminary predicted lifetime 54a, 54b is updated during the usage of the capacitor: At the beginning of its usage, a first usage cycle 51a is defined and a first preliminary predicted lifetime 54a is generated by assuming that similar usage cycles will follow behind each other. The first extrapolation 450a of the total lifetime consumption 45 based on the observation of the first usage cycle 51a is shown by the dashed-dotted line.

In the shown example however, the first usage cycle 51a is repeated only three times. After these three repetitions, the controller notices a deviation from the expected pattern. In the shown example, the user reacts to the notification of the controller and sets a second usage cycle 51b. The total lifetime consumption during this second usage cycle 51b is smaller than during the first usage cycle 51*a*. The second extrapolation 450*b* of the total lifetime consumption is adapted accordingly: starting off from the total lifetime consumption at the beginning of the second usage cycle 51*b*, the second extrapolation 450*b* assumes that the second usage cycle 51*b* will be repeated over and over again. The second extrapolation 450*b* is shown by dashed-dotted line with a smaller slope than the first extrapolation 450*a*.

In the example of FIG. 6, the preliminary predicted lifetime 54*a* based on the first usage cycle 51*a* is shorter than the maximum age 53 of the capacitor. Thereby it is the preliminary predicted lifetime 54*a* which determines the residual lifetime 52*a* as long as the usage cycle is not updated. After the update however, the preliminary predicted lifetime 54*b* based on the second usage cycle 51*b* is longer than the maximum age 53 of the capacitor. Thereby, it is the maximum age 53 which determines the residual lifetime 52*a*.

During the time when the first usage cycle 51*a* is used for the extrapolation but when it is still noticeable that the usage of the capacitor deviated from the first usage cycle 51*a*, the extrapolation considers this deviation in the example of FIG. 6 by continuing to use a linear function with a slope defined by the first usage cycle 51*a* but by shifting this function on the time axis such that is crosses the point of the actually determined total lifetime consumption at the time it is determined. This updated extrapolation 450*a\ is shown as another dashed-dotted line in the diagram and results in an updated preliminary predicted lifetime 54*a\ and consequently in an updated residual lifetime 52*a\**.

In the case shown in FIG. 6 this shifting of the extrapolation occurs as soon as a deviation from first usage cycle 51*a* is detected in the case temperature or the effective ripple current measurements. In other embodiments, the shifting of the extrapolation occurs always at the end of the defined usage cycle duration. In further embodiments or in addition to further criteria, the shifting of the extrapolation occurs if the difference between the total lifetime consumption and the extrapolation function becomes greater than a set threshold level.

Figure 7:
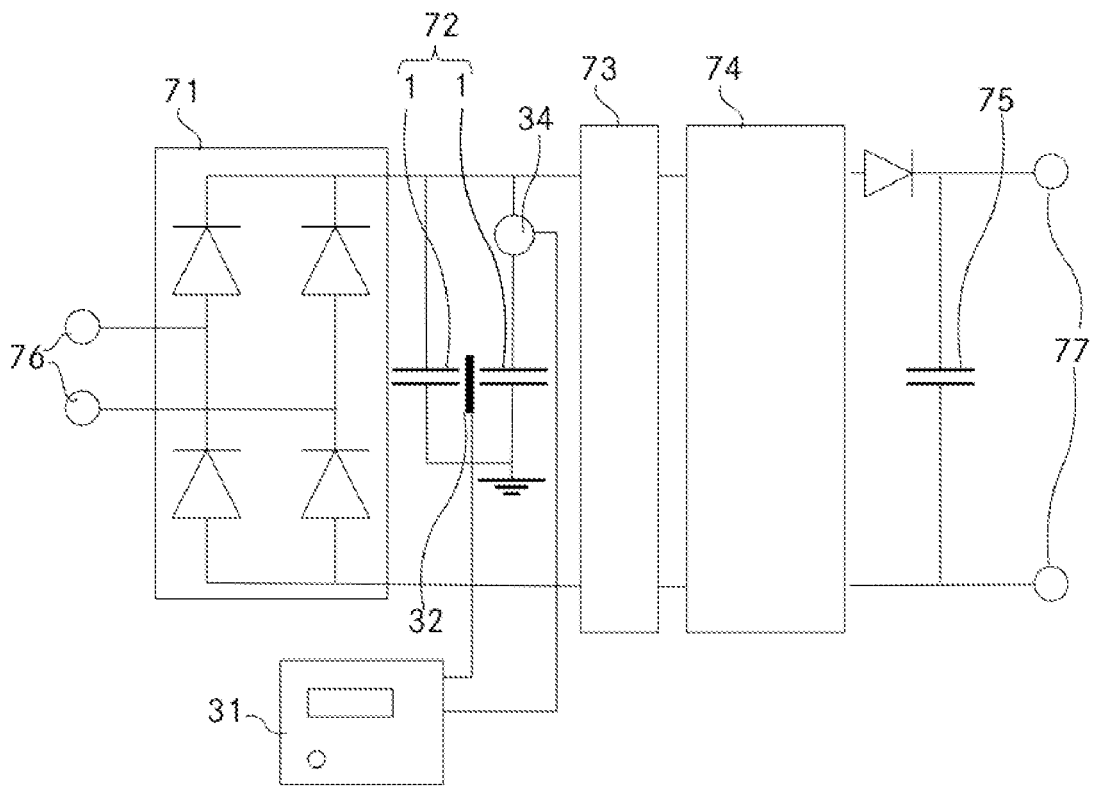
FIG. 7 is a circuit of a power supply comprising a bulk capacitor which is an electrolytic capacitor whose lifetime is estimated by a device according to the present application.

FIG. 7 shows a power supply which is an apparatus typically comprising a bulk capacitor 72 which can be constructed using electrolytic capacitors 1. In the example shown in FIG. 7, the bulk capacitor 72 is realized by a set of two electrolytic capacitors 1 of the same type which are connected in parallel. The lifetime of this bulk capacitor 72 is estimated using a device according to the present application comprising a temperature sensor 32 which is arranged between the two electrolytic capacitors such that it can measure their common case temperature 42 with a high accuracy. In the shown embodiment, the device comprises further an ammeter 34 which is used to determine the effective ripple current. The temperature sensor 32 and the ammeter 34 are connected to a controller 31 which is in this case equipped with an output device in the form of a display and an input device in the form of a button. The display can be used to return the residual lifetime as an output and to inform the user about the status of a usage cycle recording. For example, the user may push the button once to start recording a usage cycle and while the usage cycle is recorded, the display reads "rec". By pushing the button a second time, the user may indicate the end of a user cycle to the controller. By displaying the residual lifetime flashing, the user can be informed about the fact that the stored usage cycle is not a sufficiently good representation of the actual use of the apparatus. In other embodiment the controller comprises only or in addition an interface where an I/O device or a memory device carrying instructions about the usage cycle to be used and/or which can receive data from the controller can be connected. The interface can be wireless or in the form of a socket/plug system. The data to be transmitted to the memory device or to a display or which are displayed on the controller itself, can comprise the residual lifetime, the current lifetime estimate, the current lifetime consumption, the current total lifetime consumption, the timeline of the past lifetime estimates, the timeline of the past lifetime consumption, the timeline of the past values of the total lifetime consumption, the timeline of the measures case temperatures and/or the current case temperature, the timeline of the effective ripple current values, the current effective ripple current and the timeline as well as the current values of the variables used to estimate the effective ripple current. The controller may present the data in statistical form and provide the user for example with histograms showing the number of time segments with a given lifetime consumption or the number of time segments which were considered to not belong to the usage cycle set at the time of their occurrence. Further the controller can provide the user with information about the uncertainty of the determined values and the noise observed on the temperature sensor readings and probably also the ammeter and/or the voltmeter used to estimate the effective ripple current. Besides specifying the usage cycles, the user may define or update the information needed and the mode to estimate the effective ripple current. For example in some embodiments, the user may upload look-up-tables, specify the number of phases on the input side and the output mode of the power supply. In some embodiments, the user can specify if the controller should determine the ripple current frequency by analyzing current or voltage measurements or if the controller should assume a frequency spectrum based on the number of input phases and the output mode. In addition or as a further embodiment, the user may upload the frequency spectrum of the ripple current which occurs in the apparatus at hand and in the context in which this apparatus is used. Instead of uploading a frequency spectrum, the information can simply represent one or more correction factors to be applied to a measured or estimated property such as the input current, the output voltage or the output or input power to yield the estimate for the effective ripple current. In addition or as a further embodiment, the user may up- or download information about the age and the total lifetime consumption of the one or more electrolytic capacitors whose lifetime is monitored. Thereby the user can change capacitors between devices without losing the information about their residual lifetime.

The power supply shown in FIG. 7 comprises, besides the bulk capacitor 72, a rectifier 71, a switching unit 73, a transformer 74 and an output capacitor 75. The power supply shown in FIG. 7 receives input power by two phases 76 delivering AC current and voltage. The AC current is rectified by a full bridge rectifier 71. The bulk capacitor 72 is grounded on its first terminal and connected to one of the output lines of the rectifier 71 with the second terminal. The switching unit 73 creates a high frequency AC current to be transformed by the transformer 74 to the desired voltage. The AC voltage on the secondary side of the transformer 74 can be rectified by another rectifier bridge or be used directly as output 77. The FIG. 7 a single diode and an output capacitor 75 are used to rectify the output of the transformer 74 to produce a DC output voltage. In an implementation, there is a feedback from the output side to the switching unit 73 which allows to adapt the switching in a suitable way to the needs of the load connected to the power supply. In a preferred embodiment, this feedback is also used by the controller 31 to estimate the effective ripple current.

In summary, it is to be noted that the device according to the present application can be used in all apparatus using electrolytic capacitors. If there are more than two electrolytic capacitors arranged in parallel and adjacent to each other, only one temperature sensor can be arranged between any two adjacent electrolytic capacitors as, in this configuration, their lifetime estimate will be the same.

What is claimed is:

1. An apparatus, comprising one or more electrolytic capacitors and a device configured to estimate a lifetime consumption of the one or more electrolytic capacitors, the device comprising:
   a) a temperature sensor which is thermally insulated from an ambient by being arranged
      i) either between two equal electrolytic capacitors connected in parallel with each other, or
      ii) on a case of the electrolytic capacitors and covered with a layer of thermally insulating material
   and
   b) a controller which is suitable to estimate the lifetime consumption based on measurement data of the temperature sensor;
   wherein the controller estimates the lifetime consumption of the at least one electrolytic capacitor during a time segment to be proportional to a quotient of the time segment over the lifetime determined for case temperature and effective ripple current which are measured or assumed to occur during the time segment.

2. The apparatus according to claim 1, wherein the device further comprises:
   a) a meter which can measure an output or input data which is a property of a voltage, a power and/or a current which is influenced by or which influences the one or more electrolytic capacitors, and
   b) wherein the controller is suitable to include measured output or input data in its estimation of the lifetime consumption of the one or more electrolytic capacitors.

3. The apparatus according to claim 2, wherein the device further comprises at least one of the following:
   a) a first detector, suitable to detect properties of an input voltage, input current or an input power to the apparatus,
   b) a second detector, suitable to detect properties of an output voltage, output current or an output power of the apparatus
   and/or
   c) an ammeter, suitable to measure a current through the one or more electrolytic capacitors and
   wherein the controller is suitable to include the measurements of at least one of the first detector, the second detector and the ammeter in its estimation of the lifetime consumption.

4. The apparatus according to claim 1, wherein the controller estimates the effective ripple current, by considering a number of phases and/or a mode and/or a waveform on an input of the apparatus, an output mode of the apparatus and a given or measured output power value or a given or measured current value or a given or measured input voltage value.

5. The apparatus according to claim 3, wherein the controller further estimates uncertainty of the effective ripple current, by considering the number of phases and/or the mode and/or the waveform on the input of the apparatus, an output mode of the apparatus and a given or measured output power value or a given or measured current value or a given or measured input voltage value.

6. The apparatus according to claim 3, wherein the controller estimates the effective ripple current by using one of a set of look-up-tables,
   a) whereby the look-up-table to be applied is chosen depending on the number of phases and/or the mode and/or the waveform of the input of the apparatus and on an output mode of the apparatus and
   b) whereby the look-up-table returns the effective ripple current at
      i) a given or measured output power value or
      ii) at a given or measured current value or
      iii) at a given or measured input voltage value.

7. The apparatus according to claim 3, wherein the controller estimates the effective ripple current by using one of a set of look-up-tables,
   a) whereby the look-up-table to be applied is chosen depending on the number of phases and/or the mode and/or the waveform of the input of the apparatus and on an output mode of the apparatus and
   b) whereby the look-up-table returns the effective ripple current and an uncertainty in the effective ripple current at
      i) a given or measured output power value or
      ii) at a given or measured current value or
      iii) at a given or measured input voltage value.

8. The apparatus according to claim 4, wherein the controller determines an uncertainty in the lifetime consumption taking into account uncertainties in the case temperature, the effective ripple current and the time segment.

9. The apparatus according to claim 4, wherein the controller
   a) determines the lifetime consumption and its uncertainty in regular time segments;
   b) whereby each time segment is represented by a mean temperature and a mean effective ripple current which are averages over all suitable measurements obtained during the time segment, and
   c) whereby a total lifetime consumption is a sum over all previously determined lifetime consumptions, and whereby the total lifetime consumption is determined and stored.

10. The apparatus according to claim 9, wherein
    a) the apparatus allows a user to specify a usage cycle with is expected to be repeated in the future and wherein the controller determines the lifetime consumption and its uncertainty either in time segments or continuously during the usage cycle, and wherein the controller determines the usage cycle lifetime consumption by integrating the continuously determined lifetime consumptions over the usage cycle or by adding the lifetime consumption of all time segments of the usage cycle and determines the uncertainty of the usage cycle lifetime consumption
    b) whereby the usage cycle lifetime consumption is used by the controller to determine a preliminary predicted lifetime by extrapolating the total lifetime consumption linearly,
    c) whereby the preliminary predicted lifetime is a duration between a beginning of the life of the capacitor and the time at which the extrapolation of the total lifetime consumption reaches a value which indicates an end of the lifetime,
    d) whereby the controller comprises a clock counting an age of the one or more electrolytic capacitors, e) whereby a residual lifetime is estimated by the controller to be the smaller one of the following two numbers:
  i) the preliminary predicted lifetime minus a current age of the one or more electrolytic capacitors
  ii) a maximum age of the one or more electrolytic capacitors minus the current age of the one or more electrolytic capacitors,
f) and whereby the residual lifetime is returned together with its uncertainty.

11. The apparatus according to claim 10, wherein
a) the controller records the case temperature measurements or the lifetime consumptions and the estimated effective ripple current of the usage cycle during its specification and compares these recorded data sequences to the data sequences produced during times which are assumed to be repetitions of the usage cycle and
b) wherein the controller issues a signal to the user if it detects that a deviation between the recorded and the measured data is greater than a threshold, thereby warning about a loss in quality in the residual lifetime estimate and asking the user to specify a new usage cycle.

12. The apparatus according to claim 10, wherein the extrapolation of the preliminary predicted lifetime and/or the resulting residual lifetime are regularly updated such that the latest available data about age and total lifetime consumption are considered by the extrapolation.

13. The apparatus according to claim 9, wherein the controller comprises an interface and stores the temperature, the effective ripple current and the lifetime consumption for every time segment, such that they or a statistic derived from them can be exported through the interface.

14. The apparatus according to claim 1, wherein the apparatus is a power supply and comprises:
a) a rectifier,
b) a bulk capacitor,
c) a transformer and
d) and whereby the bulk capacitor comprises the at least one electrolytic capacitor and
e) whereby the lifetime consumption of the bulk capacitor is estimated with a device comprises:
  a) a temperature sensor which is thermally insulated from an ambient by being arranged
    i) either between two equal electrolytic capacitors connected in parallel with each other, or
    ii) on a case of an electrolytic capacitors and covered with a layer of thermally insulating material
  and
  b) a controller which is suitable to estimate the lifetime consumption based on measurement data of the temperature sensor.

15. The apparatus according to claim 1, wherein the apparatus is a power supply and comprises:
a) a rectifier,
b) a bulk capacitor,
c) a transformer and
d) an output capacitor
e) and whereby the bulk capacitor comprises the at least one electrolytic capacitor and
f) whereby the lifetime consumption of the bulk capacitor is estimated with a device comprises:
  a) a temperature sensor which is thermally insulated from an ambient by being arranged
    i) either between two equal electrolytic capacitors connected in parallel with each other or
    ii) on a case of an electrolytic capacitors and covered with a layer of thermally insulating material
  and
  b) a controller which is suitable to estimate the lifetime consumption based on measurement data of the temperature sensor.

16. The apparatus according to claim 1, wherein the controller estimates a lifetime of the at least one electrolytic capacitor by calculating a product of a first capacitor type depending constant and a first and a second exponential function,
a) whereby an exponent of the first exponential function is case temperature measured by the temperature sensor while the basis is a constant which is independent of capacitor type and
b) an exponent of the second exponential function is the square of an effective ripple current while the basis is a second capacitor type depending constant.

17. The apparatus according to claim 16, wherein the lifetime consumption is equal to the quotient of the time segment over the lifetime during this time segment.

* * * * *